(12) United States Patent
Zuppero et al.

(10) Patent No.: US 7,122,735 B2
(45) Date of Patent: *Oct. 17, 2006

(54) QUANTUM WELL ENERGIZING METHOD AND APPARATUS

(75) Inventors: Anthony C. Zuppero, Pollock Pines, CA (US); Jawahar M. Gidwani, San Francisco, CA (US)

(73) Assignee: Neokismet, L.L.C., San Francisco, CA (US)

( * ) Notice: Subject to any disclaimer, the term of this patent is extended or adjusted under 35 U.S.C. 154(b) by 468 days.

This patent is subject to a terminal disclaimer.

(21) Appl. No.: 10/185,086

(22) Filed: Jun. 28, 2002

(65) Prior Publication Data

US 2003/0000570 A1    Jan. 2, 2003

Related U.S. Application Data

(60) Provisional application No. 60/302,274, filed on Jun. 29, 2001.

(51) Int. Cl.
*H01L 31/058* (2006.01)
*H01L 31/06* (2006.01)

(52) U.S. Cl. .................. 136/253; 136/252; 136/254; 136/249; 136/255; 136/291; 310/300; 310/320; 310/314; 310/322; 310/304; 310/311; 60/721; 60/532; 257/29; 257/35; 257/14; 257/9; 257/79

(58) Field of Classification Search ............. 136/253, 136/252, 254, 249, 255, 291, 205, 201; 310/300, 310/320, 314, 322, 304, 311; 60/721, 532; 257/29, 35, 14, 9, 79
See application file for complete search history.

(56) References Cited

U.S. PATENT DOCUMENTS 3,694,770 A    9/1972   Burwell et al.
3,925,235 A    12/1975  Lee (Continued)

FOREIGN PATENT DOCUMENTS

DE    1230509    12/1966

(Continued)

OTHER PUBLICATIONS

Harrison, P. et al., The Carrier Dynamics of Far-Infrared Intersubband Lasers and Tunable Emitters, Institute of Microwaves and Photonics, University of Leeds, U.K., pp. 1-64, date unknown.

(Continued)

*Primary Examiner*—Alan Diamond
(74) *Attorney, Agent, or Firm*—Orrick, Herrington & Sutcliffe, LLP

(57) ABSTRACT

A method and apparatus that converts energy provided by a chemical reaction into energy for charging a quantum well device. The disclosed apparatus comprises a catalyst layer that catalyzes a chemical reaction and captures hot electrons and hot phonons generated by the chemical reaction, and an interface layer placed between the catalyst layer and a quantum well. The interface layer facilitates the transfer of hot electrons and hot phonons from the catalyst layer into the quantum well layer. The interface layer can also convert hot electrons into hot phonons, and vice versa, depending upon the needs of the particular quantum well device. Because the hot electrons and the hot phonons are unstable and readily degrade into heat energy, the dimensions of the catalyst layer and the interface layer are very small. To improve the efficiency of the transfer of hot electrons and hot phonons to the quantum well, other interface layers, such as a catalyst interlayer and a catalyst interface, may be utilized.

13 Claims, 5 Drawing Sheets

U.S. PATENT DOCUMENTS

| | | | |
|---|---|---|---|
| 4,012,301 A | 3/1977 | Rich et al. | |
| 4,045,359 A | 8/1977 | Fletcher et al. | |
| 4,407,705 A | 10/1983 | Garscadden et al. | |
| 4,590,507 A | 5/1986 | Capasso et al. | |
| 4,634,641 A | 1/1987 | Nozik | |
| 4,651,324 A | 3/1987 | Prein et al. | |
| 4,686,550 A | 8/1987 | Capasso et al. | |
| 4,753,579 A | 6/1988 | Murphy | |
| 4,756,000 A | 7/1988 | Macken | |
| 4,793,799 A | 12/1988 | Goldstein et al. | |
| 4,849,799 A | 7/1989 | Capasso et al. | |
| 5,048,042 A | 9/1991 | Moser et al. | |
| 5,057,162 A | 10/1991 | Nelson | |
| 5,293,857 A | 3/1994 | Meyer | |
| 5,299,422 A | 4/1994 | Nakagawa et al. | |
| 5,311,009 A | 5/1994 | Capasso et al. | |
| 5,317,876 A | 6/1994 | Nakagawa et al. | |
| 5,337,329 A | 8/1994 | Foster | |
| 5,408,967 A | 4/1995 | Foster | |
| 5,470,395 A | 11/1995 | Yater et al. | |
| 5,488,231 A | 1/1996 | Kwon et al. | |
| 5,525,041 A | 6/1996 | Deak | |
| 5,587,827 A | 12/1996 | Hakimi et al. | |
| 5,593,509 A | 1/1997 | Zuppero et al. | |
| 5,632,870 A | 5/1997 | Kucherov | |
| 5,641,585 A | 6/1997 | Lessing et al. | |
| 5,651,838 A | 7/1997 | Fraas et al. | |
| 5,674,698 A | 10/1997 | Zarling et al. | |
| 5,698,397 A | 12/1997 | Zarling et al. | |
| 5,736,410 A | 4/1998 | Zarling et al. | |
| 5,757,833 A | 5/1998 | Arakawa et al. | |
| 5,763,189 A | 6/1998 | Buechler et al. | |
| 5,891,656 A | 4/1999 | Zarling et al. | |
| 5,917,195 A | 6/1999 | Brown | |
| 5,932,885 A | 8/1999 | DeBellis et al. | |
| 5,999,547 A | 12/1999 | Schneider et al. | |
| 6,067,309 A | 5/2000 | Onomura et al. | |
| 6,084,173 A | 7/2000 | DiMatteo | |
| 6,114,620 A * | 9/2000 | Zuppero et al. | 136/253 |
| 6,119,651 A | 9/2000 | Anderson | |
| 6,159,686 A | 12/2000 | Kardos et al. | |
| 6,172,427 B1 | 1/2001 | Shinohara et al. | |
| 6,218,608 B1 * | 4/2001 | Zuppero et al. | 136/253 |
| 6,222,116 B1 * | 4/2001 | Zuppero et al. | 136/253 |
| 6,232,546 B1 | 5/2001 | DiMatteo et al. | |
| 6,238,931 B1 | 5/2001 | Buechler et al. | |
| 6,251,687 B1 | 6/2001 | Buechler et al. | |
| 6,268,560 B1 * | 7/2001 | Zuppero et al. | 136/253 |
| 6,312,914 B1 | 11/2001 | Kardos et al. | |
| 6,327,859 B1 * | 12/2001 | Zuppero et al. | 60/721 |
| 6,396,191 B1 | 5/2002 | Hagelstein et al. | |
| 6,399,397 B1 | 6/2002 | Zarling et al. | |
| 6,444,476 B1 | 9/2002 | Morgan | |
| 6,537,829 B1 | 3/2003 | Zarling et al. | |
| 6,569,704 B1 * | 5/2003 | Takeuchi et al. | 438/94 |
| 6,649,823 B1 * | 11/2003 | Zuppero et al. | 136/252 |
| 6,678,305 B1 | 1/2004 | Zuppero et al. | |
| 6,700,056 B1 * | 3/2004 | Zuppero et al. | 136/252 |
| 6,916,451 B1 * | 7/2005 | Zuppero et al. | 422/186.03 |
| 6,944,202 B1 * | 9/2005 | Zuppero et al. | 372/89 |
| 2001/0018923 A1 * | 9/2001 | Zuppero et al. | 136/248 |
| 2002/0017827 A1 * | 2/2002 | Zuppero et al. | 310/300 |
| 2002/0045190 A1 | 4/2002 | Wilson et al. | |
| 2002/0070632 A1 | 6/2002 | Zuppero et al. | |
| 2002/0121088 A1 | 9/2002 | Zuppero et al. | |
| 2002/0196825 A1 | 12/2002 | Zuppero et al. | |
| 2003/0000570 A1 | 1/2003 | Zuppero et al. | |
| 2003/0019517 A1 | 1/2003 | McFarland | |
| 2003/0030067 A1 | 2/2003 | Chen | |
| 2003/0100119 A1 | 5/2003 | Weinberg et al. | |
| 2003/0166307 A1 * | 9/2003 | Zuppero et al. | 438/9 |
| 2003/0168307 A1 | 9/2003 | Zuppero et al. | |
| 2003/0207331 A1 | 11/2003 | Wilson et al. | |
| 2004/0182431 A1 * | 9/2004 | Zuppero et al. | 136/243 |
| 2005/0189011 A1 * | 9/2005 | Zuppero et al. | 136/243 |

FOREIGN PATENT DOCUMENTS

| | | |
|---|---|---|
| JP | 02157012 A | 6/1990 |
| NL | 1065463 | 4/1967 |
| WO | WO 00/72384 A1 | 11/2000 |
| WO | WO 01/28677 A1 | 4/2001 |
| WO | WO 01/28677 A1 | 4/2001 |
| WO | WO 01/29938 A1 | 4/2001 |

OTHER PUBLICATIONS

Weber, et al., to X2 Electron Transfer Times in Type-II GaAsAlAs Superlattices Due to Emission of Confined and Interface Phonons, Superlattices and Microstructures, vol. 23, No. 2 (1998).

Fann, W.S. et al., Electron Thermalization in Gold, Physical Review B, Brief Reports, vol. 46, No. 20, (1992).

Ultrafast Surface Dynamics Group, Time-Resolved Two-Photon Photoemission (TR-2PPE), http://www.ilp.physik.uni-essen.de/aeschlimann/2y_photo.htm, date unknown.

Lewis et al., Vibrational Dynamics of Molecular Overlayers on Metal Surfaces, Dept. of Chemistry, University of Pennsylvania, http://lorax.chem.upenn.edu/molsurf/cucotalk/html, date unknown.

Rettner et al., Dynamics of the Chemisorption of 02 on Pt(111): Dissociation via Direct Population of a Molecularly Chemisorbed Precursor at High Incidence Kinetic Energy, The Journal of Chemical Physics, vol. 94, Issue 2 (1991).

Friedman et al., SiGe/Si THz Laser Based on Transitions Between Inverted Mass Light-Hole and Heavy Hole Standards, Applied Physics Letters, vol. 78, No. 4 (2001).

Harrison et al., Population-Inversion and Gain Estimates for a Semiconductor TASER, date unknown.

Harrison et al., Theoretical Studies of Subband Carrier Lifetimes n an Optically Pumped Three-Level Terahertz Laser, Superlattices and Microstructures, vol. 23, No. 2 (1998).

Harrison et al., Room Temperature Population Inversion in SiGe TASER Designs, IMP, School of Electronic and Electrical Engineering, The University of Leeds, date unknown.

Sun et al., Pheonon-Pumped Terhertz Gain in n-Type GaAs/AlGaAs Superlattices, Applied Physic Letters, vol. 7, No. 22 (2001).

Altukhov et al., Towards Si1-xGex Quantum-Well Resonant-State Terahertz Laser, Applied Physics Letters, vol. 79, No. 24 (2001).

Sun et al., Intersubband Lasing Lifetimes of SiGe/Si and GaAs/AlGaAs Multiple Quantum Well Structures, Applied Physics Letters, vol. 66, No. 25 (1995).

Sun et al., Phonon Pumped SiGe/Si Interminiband Terahertz Laser, date unknown.

Soref et al., Terhertz Gain in a SiGe/Si Quantum Starcase Utilizing the Heavy-Hole Inverted Effective Mass, Applied Physics Letters, vol. 79, No. 22 (2001).

Aeschlimann et al., Competing Nonradative Channels for Hot Electroni Induced Surface Photochemistry, Chemical Physics 202, 127-141 (1996).

Auerbach, Daniel J., Hitting the Surface-Softly, Science, Vo. 294, pp. 2488-2489 (2001).

Badescu et al., Energetics and Vibrational States for Hydrogen on Pt(111), Physical Review Letters, vol. 88, No. 13 (2002).

Balandin et al., Effect of Phonon Confinement on the Thermoelectric Figure of Merit of Quantum Wells, Journal of Applied Physics, vol. 84, No. 11 (1998).

Bartels et al., Coherent Zone-Folded Longitudinal Acoustic Phonons in Semiconductor Superlattices: Excitation and Detection, Physical Review Letters, vol. 82, No. 5 (1999).

Baumberg et al., Ultrafast Acoustic Phonon Ballistics in Semiconductor Heterostructers, Physical Review Letters, vol. 78, No. 17 (1997).

Bedurftig et al., Vibrational and Structural Properties of OH Adsorbed on Pt(111), Journal of Chemical Physics, vol. 111, No. 24 (1999).

Valden et al., Onset of Catalytic Activity of Gold Clusters on Titania with the Appearance of Nonmetallic Properties, Science, vol. 281 (1998).

Bondzie et al., Oxygen Adsorption on Well-Defined Gold Particles on TiO2(110), J. Vac. Sci. Technol. A17(4) (1999).

Bezant et al., Intersubband Relaxation Lefetimes in p-GaAs/AlGaAs Quantum Wells Below the LO-Ohonon Energy Measured in a Free Electron Laser Experiment, Semicond. Sci. Technol. 14 (1999).

Brako et al., Interaction of CO Molecules Adsorbed on Metal Surfaces, Vacuum 61,89-93 (2001).

Burgi et al., Confinement of Surface State Electronis in Fabry-Perot Resonators, Physical Review Letters, vol. 81, No. 24 (1998).

Burgi et al., Probing Hot-Electron Dynamics at Surfaces with a Cold Scanning Tunneling Microscope, Physical Review Letters, vol. 82, No. 22 (1999).

Chang, Y.M., Interaction of Electron and Hold Plasma with Coherent Longitudinal Optical Phonons in GaAs, Applied Physics Letter, vol. 80, No. 14 (2002).

Chang et al., Observation of Coherent Surface Optical Phonon Oscillations by Time-Resolved Surface Second-Harmonic Generation, Physical Review Letters, vol. 78, No. 24 (1997).

Chang et al., Coherent Phonon Spectroscopy of GaAs Surfaces Using Time-Resolved Second-Harmonic Generation, Chemical Physics 251, 283-308 (2000).

Chang et al. Observation of Local-Interfacial Optical Phonons at Buried Interfaces Using Time-Resolved Second Harmonic Generation, Physical Review B, vol. 59, No. 19 (1999).

Chen et al., Stimulate-Emission-Induced Enhancement of the Decay Rate of Longitudinal Optical Phonons in III-V Semiconductors; Applied Physics Letters, vol. 80, No. 16 (2002).

Corcelli et al., Vibrational Energy Pooling in CO on NaCl(100): Methods, Journal of Chemical Physics, vol. 116, No. 18 (2002).

Fierz et al., Time-Resolved 2-Photon Photoionization on Metallic Nanoparticles, Appl. Phys. B 68 (1999); http://www.ilp.physik.uni-essen.de/aeschlimann/abstract.htm#6.

Bezant et al., Intersubband Relaxation Lifetimes in p-GaAs/AlGaAs Quantum Wells Below the LO-Phonon Energy Measured in a Free Electron Laser Experiments, Semicond. Sci. Technol., 14 No. 8 (1999).

Bondzie et al., Oxygen Adsorption on Well-Defined Gold Particles on TiO2(110), Journal of Vacuum Science & Technology A: Vacuum, Surfaces and Films, vol. 17, Issue 4, pp. 1717-1720 (1999).

Harrison et al., Maximising the Population Inversion, by Optimizing the Depopulation Rate, in Far-Infared Quantum Cascade Lasers (2001).

Harrison et al., The Carrier Dynamics of Terahertz Intersubband Lasers, Some Publishing Company (1999).

Fann et al., Electron Thermalization in Gold, Physical Review B, vol. 46, No. 20 (1992).

Cummings et al., Ultrafast Impulsive Excitation of Coherent Longitudinal Acoustic Phonon Oscillations in Highly Potoexcited InSb, Applied Physics Letters, vol. 79, No. 6 (2001).

Chiang, T.C., Photoemission Studies of Quantum Well States in Thin Films, Surface Science Reports 39, pp. 181-235 (2000).

Debernardi et al., Anharmonic Phonon Lifetimes in Semiconductors from Density-Functional Perturbation Theory, Physical Review Letters, vol. 75, No. 9 (1995).

Davis et al., Kinetics and Dynamics of the Dissociative Chemisorption of Oxygen on Ir(111), J. Chem. Phys. 109 (3) (1997).

Choi et al., Ultrafast Carrier Dynamics in a Highly Excited GaN Epilayer, Physical Review B., Vo. 63, 115315 (2001).

Diekhoner et al., Parallel Pathways in Methanol Decomposition on PT(111), Surface Science 409, pp. 384-391 (1998).

Demidenko et al., Piezoelectrically Active Acoustic Waves Confined in a Quantum Well and Their Amplification by electron Drift, Semiconductor Physics, Quantum Electronics & Optoelectronis, vol. 3, No. 4, pp. 427-431 (2000).

de Paula et al., to X2 Electron Transfer Times in Type-II Superlattices Due to Emission of Confined Phonons, Appl. Phys. Lett. 65 (10) (1994).

de Paula et al., Carrier Capture via Confined Phonons in GaAs—AlGaAs Multiple Quantum Wells, Seicond. Sci. Technol. 9, pp. 730-732 (1994).

Demidenko et al., Amplification of Localized Acoustic Waves by the Electron Drift in a Quantum Well, Semiconductor Physics, Quantum Electronics & Optoelectronics, vol. 2, No. 1, pp. 11-24 (1999).

Demidenko et al., Generation of Coherent Confined Acoustic Phonons by Drifting Electrons in Quantum Wire; Semiconductor Physics, Quantum Electronics & Optoelectronics, vol. 3, No. 4, pp. 432-437 (2000).

Denzler et al., Surface Femtochemistry: Ultrafast Reaction Dynamics Driven by Hot Electron Mediated Reaction Pathways, World Scientific (2001).

Fatti et al., Temperature-Dependent Electron-lattice Thermalization in GaAs, Physical Review B, vol. 59, No. 7 (1999).

Anastassakis et al., The Physics of Semiconductors, vol. 2, World Scientific (1990).

de Paula et al., Carrier Capture Processes in Semiconductor Superlattices due to Emission of confined Phonons, J. Appl. Phys. 77 (12) (1995).

Engstrom et al., Comparing the Vibrational Properties of Low-Energy Modes of a Molecular and an Atomic Adsorbate: CO and O on Pt(111), Journal of Chemical Physics, vol. 112, No. 4 (2000).

Glavin et al., Generation of High-Frequency Coherent Acoustic Phonons in a Weakly Coupled Superlattice, Applied Physics Letters, vol. 74, No. 23 (1999).

Friedman, SiGe/Si Thz Laser Based on Transitions Between Inverted Mass Light-Hole and Heavy-Hole Subbands, Applied Physics Letters, vol. 78, No. 4 (2001).

Ermoshin et al., Vibrational Energy Relaxation of Adsorbate Vibrations; A theoretical Study of the H/Si(111) System, J. Chem. Phys. 105 (20) (1996).

Glavin et al., Acoustic Phonon Generation in A Superlattice Under the Hopping Perpendicular Transport, United Nations Educational Scientific and Cultural Organization and International Atomic Energy Agency (1998).

Gergen et al., Chemically Induced Electronic Excitations at Metal Surfaces, Science, vol. 294 (2001).

Hagston et al., Simplified Treatment of Scattering Processes in Quantum Well Structures, Journal of Applied Physics, vol. 90, No. 3 (2001).

Harrison et al., Room Temperature Population Inversion in SiGe TASER designs, date unknown.

Harrison et al., Population-Inversion and Gain Estimates for a Semiconducor Taser, date unknown.

Harrison et al., Theoretical studies of Subband Carrier Lifetimes in an Optically Pumped Three-Level Terahertz Laser, Superlattices and Microstructures, vol. 23, No. 2 (1998).

Harrison et al., The Carrier Dynamics o Far-Infared Intersubband Lasers and Tunable Emitters, www.ee.leeds.ac.uk/homes/ph/, date unknown.

Hess et al., Hot Carrier Relaxation by Extreme Electron-LO Phonon Scattering in GaN, date unknown.

Hohlfeld et al., Electron and Lattice Dynamics Following Optical Excitation of Metals, Chemical Physics 251, pp. 237-258 (2000).

Huang et al., Vibrational Promotion of Electron Transfer, Science, vol. 290 (2000).

Kawakami et al., Quantum-well States in Copper Thin Films, Nature, vol. 398 (1999).

Kohler et al., Enhanced Electron-Phonon Coupling at the Mo and W (110) Surfaces Induced by Adsorbed Hydrogen, mtrt-th/9510004 (1995).

Lewis et al., Continuum Elastic Theory of Adsorbate Vibrational Relaxation, J. Chem. Phys. 108 (3) (1998).

Lewis et al., Controlling Adsorbate Bivrational Lifetimes Using Superlattices, Physical Review B, vol. 63, 085402 (2001).

Komirenko, Sergey M., Phonons and Phonon-Related Effects in Prospective Nanoscale Semiconductor Devices (2000).

Huang et al., Observation of Vibrational Excitation and Deexcitation for NO(v=2) Scattering from Au(111): Evidence for Electron-Hole-Pair Mediate Energy Transfer, Physical Review Letters, vol. 84, No. 13 (2000).

Lewis et al, Substrate-Adsorbate Coupling in Co-Adsorbed Copper, Physical Review Letters, vol. 77, No. 26 (1996).

Krauss et al., Coherent Acoustic Phonons in a Semiconductor Quantum Dot, Physical Review Letters, vol. 79, No. 25 (1997).

Lugli et al., Interaction of Electrons with Interface Phonons in GaAs/AlAs and GaAs/AlGaAs Heterostructures, Semicond. Sci. Technol. 7 (1992).

Nienhaus et al., Electron-Hole Pair Creation at Ag and Cu Surfaces by Adsorption of Atomic Hydrogen and Deuterium, Physical Review Letters, vol. 82, No. 2 (1999).

Mulet et al., Nanoscale Radiative Heat Transfer Between a Small Particle and a Plane Surface, Applied Physics Letters, vol. 78, No. 19 (2001).

Nienhaus et al., Direct Detection of Electron-Hole Pairs Generated by Chemical Reactions on Metal Surfaces, Surface Science 445, pp. 335-342 (2000).

Nienhaus, Hermann, Electronic Excitations by Chemical Reactions on Metal Surfaces, Surface Science Reports 45, pp. 1-78 (2002).

Nolan et al., Translational Energy selection of Molecular Precursors to Oxygen Adsorption on Pt(111), Physical Review Letters, vol. 81, No. 15 (1998).

Nienhaus et al., Selective H Atom Sensors Using Ultrathin Ag/Si Schottky Diodes, Applied Physics Letters, vol. 74, No. 26 (1999).

Nolan et al., Moleculary Chemisorbed Intermediates to Oxygen Adsorption on Pt(111): A Molecular Beam and Electron Energy-Loss Spectroscopy Study, Journal of Chemical Physics, vol. 111, No. 8 (1999).

Nolan et al., Direct Verification of a High-Translational-Energy Molecular Precursor to Oxygen Dissociation on Pd(111), Surface Science 419 (1998).

Ogawa et al., Optical Intersubband Transitions and Femtosecond Dynamics in Ag/Fe(100) Quantum Wells, Physics Review Letters, vol. 88, No. 11 (2002).

Plihal et al., Role of Intra-Adsorbate Coulomb Correlations in Energy Transfer at Metal Surfaces, Physical Review B, vol. 58, No. 4 (1998).

Paggel et al., Quantum-Well States as Fabry-Perot Modes in a Thin-Film Electron Interferometer, Science, vol. 283 (1999).

Paggel et al., Quasiparticle Lifetimes in Macroscopically Uniform Ag/Fe(100) Quantum Wells, Physical Review Letters, vol. 81, No. 25 (1998).

Paggel et al., Quantum Well Photoemission from Atomically Uniform Ag Films: Determination of Electronic Band Structure and Quasi-Particle Lifetime in Ag(100) Applied Surface Science 162-163, pp. 78-85 (2000).

Persson et al., A First-Principles Potential Energy Surface for Eley-Rideal Reaction Dynamics of H Atoms on Cu(111), Journal of Chemical Physics, vol. 110, No. 4 (1999).

Ozgur et al., Control of Coherent Acoustic Phonons in InGaN Multiple Quantum Wells, arXiv:cond-mat/0010170 (2000).

Stanton et al., Energy Relaxation by Hot Electrons in n-GaN Epilayers, Journal of Applied Physics, vol. 89, No. 2 (2001).

Stipe et al., Atomistic Studies of O2 Dissociation on Pt(111) Induced by Photons, Electrons and by Heating, J. Chem. Phys. 107 (16) (1997).

Sun et al., Phonon Pumped SiGe/Si Interminiband Terahertz Laser, pp. 1-11, date unknown.

Soref et al., Terahertz Gain in a SiGe/Si Quantum Staircase Utilizing the Heavy-Hole Inverted Effective Mass, Applied Physics Letters, vol. 79, No. 22 (2001).

Qu et al., Long-Lived Phonons, Physical Review B, vol. 48, No. 9 (1993).

Pontius, et al., Size-Dependent Hot-Electron Dynamics in Small Pdn-Clusters, Journal of Chemical Physics, vol. 115, No. 22 (2001).

Smit et al., Enhanced Tunneling Across Nanometer-Scale Metal-Semiconductor Interfaces, Applied Physics Letters, vol. 80, No. 14 (2002).

Qiu et al., Long-Distance and Damping of Low-Frequency Phonon Polariton in LiNbO3, Physical Review B, vol. 56, No. 10 (1997).

Rousse et al, Non-Thermal Melting in Semiconductors Measured at Femtosecond Resolution, Nature, vol. 410 (2001).

Schelling et al., Phonon Wave-Packet Dynamics at Semiconductor Interfaces by Molecular-Dynamics Simulation, Applied Physics Letters, vol. 80, No. 14 (2002).

Shikin et al., Phase Accumulation Model Analysis of Quantum Well Resonances Formed in Ultra-Thin Ag, Au Films on W(110), Surface Science (2001).

Show et al., Ultrathin PtSi Layers Paterned by Scanned Probe Lithography, Applied Physics Letters, vol. 79, No. 8 (2001).

Prabhu et al., Femtosecond Energy Relaxation of Nonthermal Electrons Injected in p-doped GaAs Base of a Heterojunction Bipolar Transistor, Journal of Applied Physics, vol. 90, No. 1 (2001).

Tsai et al., Theoretical Modeling of Nonequilibrium Optical Phonons and Electron Energy Relaxation in GaN, Journal of Applied Physics, vol. 85, No. 3 (1999).

Tripa et al., Surface-Aligned Photochemistry: Aiming Reactive Oxygen Atoms Along a Single Crystal Surface, Journal of Chemical Physics, vol. 112, No. 5 (2000).

Tripa et al., Surface-Aligned Reaction of Photogenerated Oxygen Atoms with Carbon Monoxide Targets, Nature, vol. 398 (1999).

Tripa et al., Kinetics Measurements of CO Photo-Oxidation on Pt(111), J. Chem. Phys. 105 (4) (1996).

Taylor et al., Strong Electron-LO Phonon Scattering and Hot Carrier Relaxation in GaN, Abstract No. ha249KW3, date unknown.

Sun et al., Phonon-Pumped Terahertz Gain in n-Type GaAs/AlGaAs Superlattices, Applied Physics Letters, vol. 78, No. 22 (2001).

Tom et al., Coherent Phonon and Electron Spectroscopy on Surfaces Using Time-Resolved Second-Harmonic Generation, date unknown.

Tiusan et al., Quantum Coherent Transport Versus Diode-Like Effect in Semiconductor-Free Metal/Insulator Structure, Applied Physics Letters, vol. 79, No. 25 (2001).

Stromquist et al., The Dynamics of H Absorption in and Adsorption on Cu(111), Surface Science 397, pp. 382-394 (1998).

Weber et al., Carrier Capture Processes in GaAs—AlGaAs Quantum Wells Due to Emission of Confiend Phonons, Appl. Phys. Lett. 63 (22) (1993).

Wintterlin et al., Atomic and Macroscopic Reaction Rates of a Surface-Catalyzed Reaction, Science, vol. 278 (1997).

Yeo et al., Calorimetric HEats for CO and Oxygen Adsorptin and for the Catalytic CO Oxidation Reaction on Pt(111), J. Chem. Phys. 106 (1) (1997).

Witte et al., Low Frequency Vibrational Modes of Adsorbates, Surface Science, No. 1362 (2002).

Xu et al., Electrical Generation of Terahertz Electromagnetic Pulses by Hot-Electrons in Quantum Wells, Superlattices and Microstructures, vol. 22, No. 1 (1997).

Wanke et al., Injectorless Quantum-Cascade Lasers, Applied Physics Letters, vol. 78, No. 25 (2001).

Zhdanov, Vladimir P., Nm-Sized Metal Particles on a Semiconductor Surface, Schottky Model, etc., Surface Science, SUSC 2931 (2002).

Yeo et al., Calorimetric Investigation of NO and O adsorption on Pd(100) and the Influence of Preadsorbed Carbon, J. Chem. Phys. 106 (5) (1997).

Zambelli et al., Complex Pathways in Dissociative Adsorption of Oxygen on Platinum, Nature, vol. 390 (1997).

Zhdanov et al., Substrate-Mediated Photoinduced Chemical Reactions on Ultrathin Metal Films, Surface Science 432 (1999).

Altukhov et al., Towards Si1–xGex Quantum-well Resonant-State Terahertz Laser, Applied Physics Letters, vol. 79, No. 24 (2001).

Friedman et al., SiGe/Si THz Laser Based on Transitions Between Inverted Mass Light-Hole and Heavy-Hole Subbands, Applied Physics Letters, vol. 78, No. 4 (2001).

Harrison et al., The Carrier Dynamics of Terhertz Intersubband Lasers, Some Publishing Company (1999).

Harrison et al., The Carrier Dynamics of Far-Infared Intersubband Lasers and Tunable Emitters, www.ee.leeds.ac.uk/homes/ph/, date unknown.

Harrison et al., Theoretical Studies of Subband Carrier Lifetimes in an Optically Pumped Three-Level Terhertz Laser, Superlattices and Microstructures, vol. 23, No. 2 (1998).

Harrison et al., Room Temperature Populatin Inversion in SiGe TASER Designs, date unknown.

Harrison et al., Population-Invension and Gain Estimates for a Semiconductor TASER, date unknown.

Sun et al., Intersubband Lasing Lifetimes of SiGe/Si and GaAs/AlGaAs Multiple Quantum Well Structures, Appl. Phys. Letter 66 (25) (1995).

Sun et al., Phonon-Pumped Terhertz Gain in n-Type GaAs/AlGaAs Superlattices, Applied Physics Letters, vol. 78, No. 22 (2001).

Albano et al., Adsorption-Kinetics of Hot Dimers, SciSearch Databaseof the Institute for Scientific Information (1999).

Casassa et al., Time-Resolved Measurements of Vibrational Relaxatin of Molecules on surfaces: Hydroxyl Groups on Silica Surfaces, Journal of Vacuum Science & Technology A: Vacuum, Surfaces, and Films, vol. 3, Issue 3 (1985).

Cavanagh et al., Vibrational Relaxation of Adsorbed Molecules: Comparison with Relaxation Rates of Model Compounds, Journal of Vaccum Science & Technology A: Vacuum, Surfaces and Films, vol. 5, Issue 4 (1987).

Hyh et al., Methanol Oxidation of Palladium Compared to Rhodium at Ambient Pressures as Probed by Surface-Enhanced Raman and Mass Spectroscopies, Journal of Catalysis, vol. 174 (2) (1998).

Gumhalter et al., Effect of Electronic Relaxation on Covalent Adsorption Reaction Rates, Physical Review B, vol. 30, Issue 6 (1984).

Nolan et al., Surface Science, Direct Verification of a High-Translational-Energy Molecular Precursor to Oxygen Dissociation on Pd(111), Surface Science, vol. 419 (1998).

Phihal et al., Role of Intra-Adsorbate Coulomb Correlations in Energy Transfer at Metal Surfaces, Physical Review B, vol. 58, Issue 4 (1998).

Tully et al., Electronic and Phonon Mechanisms of vibrational Relaxation: CO on Cu(100), J. Vac. Sci. Technol. A 11(4) (1993).

DiMatteo et al., Enhanced Photogeneration of Carriers in a Semocnductor Via Coupling Across a Nonisothermal Nonscale Vacuum Gap, Applied Physics Letters, vol. 79, Issue 12 (2001).

Tripa et al., Surface-Aligned Photochemistry: Aiming Reactive Oxygen Atoms Along a Single Crystal Surface, The Journal of Chemical Physics, vol. 112, Issue 5 (2000).

Yates et al., Special Adsorption and Reaction Effects at Step Defect Sites on Platinum Single Crystal Surfaces (2000).

Auerbach, Daniel J.; "Hitting the Surface—Softly"; Science, 294, (2001), pp. 2488-2489.

Bondzie, V.A., et al.; "Oxygen adsorption . . . gold particles . . . TiO2(110)"; J. Vac. Sci. Tech. A., (1999) 17, pp. 1717 and figure 3.

Boulter, James; "Laboratory Measurement of OH . . . "; http://pearlt.lanl.gov/wsa2002/WSA2002talks.pdf, (2002).

Chan H.Y.H., et al.; Methanol Oxidation On Palladium Compared To Rhodium . . . ; J. Catalysis v. 174(#2) pp. 191-200 (1998) (abstract and figure 1 only).

Chiang, T.-C. ; Photoemission studies of quantum well states in thin films; Surf. Sci. Rpts.39 (2000) pp. 181-235.

Chubb, D. L., et al; "Semiconductor Silicon as a Selective Emitter"; http://www.thermopv.org/TPV5-2-05-Chubb.pdf (abstract only).

Corcelli, S. A., et al.; "Vibrational energy pooling in CO on NaCl(100) . . . "; J. Chem. Phys.(2002) 116, pp. 8079-8092.

Danese, A., et al.; "Influence of the substrate electronic structure on metallic quantum well . . . "; Prog. Surf. Sci., 67, (2001), pp. 249-258.

Davis, J. E., et al.; "Kinetics and dynamics of the dissociative chemisorption of oxygen on Ir(111)"; J. Chem. Phys. 107 (3), (19970, pp. 943-952.

Diekhoner, L., et al.; "Parallel pathways in methanol . . . Pt(111)"; Surf. Sci. 409 (1998) pp. 384-391.

Diesing, D., et al.; "Aluminium oxide tunnel junctions . . . "; Thin Solid Films, vol. 342 (1-2). (1999) pp. 282-290.

DiMatteo, R. S., et al.; "Enhanced photogeneration of carriers . . . vacuum gap"; Appl. Phys. Let. (2001) 79, pp. 1894-1896.

DiMatteo, R. S., et al.; "Introduction to and Experiment Demonstration of Micro-gap ThermoPhoto Voltaics"; http://www.thermopv.org/37DiMatteo.html (abstract only).

Dogwiler, Urs, et al.; "Two-dimensional . . . catalytically stabilized . . . lean methane-air . . . "; Combustion and Flame, (1999), 116(1,2), pp. 243-258.

Echenique, P. M. , et al.; "Surface-state electron dynamics in noble metals"; Prog. Surf. Sci., 67, (2001), pp. 271-283.

Endo, Makoto, et al.; "Oxidation of methanol . . . on Pt(111) . . . "; Surf. Sci. 441 ( 1999) L931-L937, Surf. Sci. Letters.

Fan, C. Y., et al.; "The oxidation of CO on RuO2 . . . "; J. Chem. Phys. 114, (2001), pp. 10058-10062.

Fann, W.S. , et al.; "Electron thermalization in gold"; Phys. Rev. B (1992) 46 pp. 13592-13595.

Gee, Adam T., et al.; "The dynamics of O2 adsorption on Pt(533) . . . "; J. Chem. Phys.(2000) 113, pp. 10333-10343.

Gergen, Brian, et al.; "Chemically Induced Electronic Excitations at Metal Surfaces" ; Science,294, (2001) pp. 2521-2523.

Guliants, Etena A., et al.; "A 0.5-µm-thick polycrystalline silicon Schottky . . . "; Appl. Phys. Let., (2002), 80, pp. 1474-1476.

Gumhalter, B., et al.; "Effect of electronic relaxation . . . adsorption reaction rates"; Phys. Rev. B (1984) 30 pp. 3179-3190.

Halonen, Lauri, et al.; "Reactivity of vibrationally excited methane on nickel . . . "; J. Chem. Phys.(2001) 115, pp. 5611-5619.

Hasegawa, Y., et al.; Modification of electron . . . standing wave . . . Pd . . . ; Surf. Sci., in press, Apr. 11, 2002.

Henry, Claude R.; "Catalytic activity . . . nanometer-sized metal clusters"; Applied Surf. Sci., 164, (2000) pp. 252-259.

Hess, S., et al.; "Hot Carrier Relaxation . . . Phonon Scattering in GaN"; http://www.physics.ox.ac.uk/rtaylor/images/hot%20carrier%20poster.pdf.

Ho, Wilson; http://www.lassp.cornell.edu/lassp_data/wilsonho.html.

Hohlfeld, J, et al.; "Electron and lattice dynamics . . . optical excitation of metals"; Chemical Physics, 251 (2000) pp. 237-258.

Honkala, Karoliina, et al.; "Ab initlo study of O2 precursor states on the Pd(111) . . . "; J. Chem. Phys. (2001) 115, pp. 2297-2302.

Hou, H.; Y., et al.; "Chemical Interactions of Super-Excited Molecules on Metal Surfaces"; http://www2.chem.ucsb.edu/~wodtke/papers/dan1.pdf, date unknown.

Hou, H., et al.; "Direct multiquantum relaxation of highly vibrationally excited NO . . . "; J. Chem. Phys., 110, (1999) pp. 10660-10663.

Huang Y., et al., "Observation of Vibrational Excitation and Deexcitation for NO from Au(111) . . . "; Phys. Rev. Lett., 84, (2000) pp. 2985-2988.

Huang, Yuhui, et al.; "Vibrational Promotion of Electron Transfer"; Science, vol. 290, 6 Oct. 2000, pp. 111-113.

IBH; "NanoLED overview"; http://www.ibh.co.uk/products/light_sources/nanoled_main.htm, date unknown.

IBH; "Red picosecond laser sources"; http://www.ibh.co.uk/products/light_sources/nanoled/heads/red_laser_heads.htm, date unknown.

Iftimia, Ileana, et al.; "Theory . . . scattering of molecules from surface"; Phys. Rev. B (2002) 65, Article 125401.

Ishikawa, Yasuyuki, et al.; "Energetics of H2O dissociation and COads+OHads reaction . . . Pt . . . "; Surf. Sci. preprints SUSC 12830, Apr. 27, 2002.

Johnson, R. Colin ; "Molecular substitution . . . terahertz switch arrays"; EE Times, (Apr. 10, 2000, 3:35 p.m. EST) http://www.eet.com/story/OEG200004105S00057.

Kao, Chia-Ling, et al.; "The adsorption . . . molecular carbon dioxide on Pt(111) and Pd(111)"; Surf. Sci., (2001) Article 12570.

Katz, Gil, et al.; "Non-Adiabatic Charge Transfer Process of Oxygen on metal Surfaces"; Surf. Sci. 425(1) (1999) pp. 1-14.

Kawakami, R. K., et al.; "Quantum-well states in copper thin films"; Nature, 398, (1999) pp. 132-134.

Komeda, T., et al.; "Lateral Hopping of Molecules Induced by Excitation of Internal Vibration . . . "; Science, 295, (2002) pp. 2055-2058.

Lewis, Steven P., et al.; "Continuum Elastic Theory of Adsorbate Vibrational Relaxation"; J. Chem. Phys. 108, 1157 (1998).

Lewis, Steven P., et al.; "Substrate-adsorbate coupling in CO-adsorbed copper"; Phys. Rev. Lett. 77, 5241 (1996).

Li, Shenping, et al.; "Generation of wavelength-tunable single-mode picosecond pulses . . . "; Appl. Phys. Let. 76, (2000) pp. 3676-3678.

Mitsui, T., et al.; "Coadsorption and interactions of O and H on Pd(111)"; Surf. Sci., Article 12767, (2002).

Moula, Md. Golam, et al.; "Velocity distribution of desorbing CO2 in CO oxidation on Pd(110) . . . "; Applied Surf. Sci., 169-170, pp. 268-272 (2001).

Mulet, Jean-Philippe, et al.; "Nanoscale radiative heat transfer between a small particle . . . "; Appl. Phys. Let., 78, (2001) p. 2931.

Nienhaus, H, et al.; "Direct detection of electron-hole pairs generated by chemical reactions on metal surfaces"; Surf. Sci. 445 (2000) pp. 335-342.

Nienhaus, H. ; "Electronic excitations by chemical reactions on metal surfaces"; Surf. Sci. Rpts. 45 (2002) pp. 1-78.

Nienhaus, H., et al.; "Selective H atom sensors using ultrathin Ag/Si Schottky diodes"; Appl. Phys. Let. (1999) 74, pp. 4046-4048.

Nienhaus, Hermann; "Electron-hole pair creaction by reactions at metal surfaces"; APS, Mar. 20-26, 1999, Atlanta, GA, Session SC33 [SC33.01].

Nienhaus, H, et al.; "Electron-Hole Pair Creation at Ag and Cu . . . of Atomic Hydrogen and Deuterium" ; Phys. Rev. Lett., 82, (1999) pp. 446-449.

Nolan P. D., et al.; "Direct verification of . . . precursor to oxygen dissociation on Pd(111)"; Surf. Sci. v. 419(#1) pp. L107-L113, (1998).

Nolan, P. D., et al.; "Molecularly chemisorbed intermediates to oxygen adsorption on Pt . . . "; J. Chem. Phys. 111, (1999), pp. 3696-3704.

Nolan, P. D., et al.; "Translational . . . Precursors to Oxygen Adsorption on Pt(111)"; Phys. Rev. Lett., 81, (1998) pp. 3179-3182.

Ogawa, S., et al.; "Optical . . . and Femtosecond Dynamics in Ag/Fe(100) Quantum Wells"; Phys. Rev. Lett. 88, 116801 (2002).

Paggel, J. J., et al.; "Quantum-Well States as Fabry-Pérot Modes in a . . . "; Science, 283, (1999), pp. 1709-1711.

Paggel, J. J., et al.; "Quasiparticle Lifetime . . . Ag/Fe(100) Quantum Wells"; Phys. Rev. Lett. (1998) 81, pp. 5632-5635.

Paggel, J.J., et al.; "Quantum well photoemission from atomically uniform Ag films . . . "; Applied Surf. Sci., 162-163, (2000), pp. 78-85.

Rettner, C. T., et al; "Dynamics . . . chemisorption of O2 on Pt(111) . . . chemisorbed precursor . . . "; J. Chem. Phys. (1991) 94, pp. 1626-1635 (abstract only).

Rinnemo, Mats; "Catalytic Ignition and Kinetic Phase Transitions"; 1996; http://www2.lib.chalmers.se/eth/diss/doc/9596/RinnemoMats.html.

Robertson, A. J. B.; "Catalysis of Gas Reactions by Metals"; Logos Press Limited; 1970; LC # 70-80936; pp. 1-5, 10, 41; Great Britain, Adlard & son Ltd.

Schewe, P., et al.; "CO2 Production at the Single-Molecule Level"; http://www.afp.org/enews/physnews/2001/split/561-1.html.

Sheng, H., et al.; "Schottky diode with Ag on (110) epitaxial ZnO film"; Appl. Phys. Let. (2002) 80, pp. 2132-2134.

Smit, G. D. J., et al.; "Enhanced tunneling across nanometer-scale metal-semiconductor interfaces"; Appl. Phys. Let. (2002) 80, pp. 2568-2570.

Snow, E. S., et al.; "Ultrathin PtSi layers patterned by scanned probe lithography"; Appl. Phys. Let. (2001) 79, pp. 1109-1111.

Stipe, B. C., et al.; "Atomistic studies of O2 dissociation on Pt(111) induced by photons . . . "; J. Chem. Phys., (1997) 107 pp. 6443-6447.

Sun, C.-K., et al.; "Femtosecond studies of carrier dynamics in InGaN"; Appl. Phys. Let. (1997) 70 pp. 2004-2006.

Svensson, K., et al.; "Dipole Active Vibrational Motion in the Physisorption Well"; Phys. Rev. Lett., 78, (1997) pp. 2016-2019.

Tarver, Craig M. ; "Non-Equilibrium Chemical Kinetic . . . Explosive Reactive Flows"; Fall 1999 IMA Workshop: High-Speed Combustion in Gaseous and Condensed-Phase.

Taylor, R.A., et al.; "Strong Electron-LO Phonon Scattering and Hot Carrier Relaxation in GaN"; http://www.physics.ax.ac.uk/rtaylor/images/ha249kw3.pdf, date unknown.

Teodorescu, C.M., et al.; "Structure of Fe layers grown on InAs . . . "; Appl. Surf. Sci., 166, (2000) pp. 137-142.

Tiusan, C., et al.; "Quantum coherent transport versus diode-like effect in . . . "; Appl. Phys. Let. 79, (2001) pp. 4231-4233.

Tripa, C. Emil, et al.; "Surface-aligned photochemistry: Aiming reactive oxygen atoms . . . "; J. Chem. Phys., (2000) 112 pp. 2463-2469.

Tripa, C. Emil, et al.; "Surface-aligned reaction of photogenerated oxygen atoms with . . . "; Nature 398, pp. 591-593 (1999).

Tripa, C. Emil; "Special Adsorption and Reaction Effects at Step Defect Sites on Platinum . . . "; http://www.chem.pitt.edu/thesis.html#tripa (abstract only), date unknown.

Volkening, S., et al.; "CO oxidation on Pt(111)—Scanning tunneling microscopy experiments . . . "; J. Chem. Phys. (2001) 114, pp. 6382-6395.

Watson, D.T.P., et al.; "Isothermal and temperature-programmed oxidation of CH over Pt . . . "; Surf. Sci. preprint, year 2001.

Watson, D.T.P., et al.; "Surface products of the dissociative adsorption of methane on Pt . . . "; Surf. Sci. preprint, o. Oct. 2001.

Wilke, Steffen, et al.; "Theoretical investigation of water formation on Rh and Pt Surfaces"; J. Chem. Phys., 112, (2000) pp. 9986-9995.

Wintterlin, J, et al; "Atomic . . . Reaction Rates . . . Surface-Catalyzed . . . "; Science, 278, (1997) pp. 1931-1934.

Wintterlin, J, R., et al.; "Existence of a "Hot" Atom Mechanism for the Dissociation of O2 on Pt(111)"; Phys. Rev. Lett., 77, (1996), pp. 123-126.

Zambelli, T., et al.; "Complex pathways in dissociative adsorption of oxygen on platinum"; Nature 390, pp. 495-497 (1997).

Zhdanov, V.P., et al.; "Substrate-mediated photoinduced chemical reactions on ultrathin metal films"; Surf. Sci., V. 432 (#3) pp. L599-L603, (1999).

Zhdanov, Vladimir P.; "Nm-sized metal particles on a semiconductor surface, Schottky . . . "; Surf. Sci. PROOF SUSC 2931, Apr. 20, 2002.

Zhukov, V. P., et al.; "Lifetimes of quasiparticle excitations in 4d transition metals . . . "; Phys. Rev. B (2002) 65, Article 115116.

Ree, J. et al., "Dynamics of Gas-Surface Interactions: Reaction of Atomic Oxygen with Chemisorbed Hydrogen on TUNGSTEN," Journal of Physical Chemistry, vol. 101 (#25), pp. 4523-4534, Jun. 19, 1997.

Ree, J. et al., "Reaction of atomic oxygen with adsorbed carbon monoxied on a platinum surface," Journal of Chemical Physics, vol. 104, Issue 2, pp. 742-757, Jan. 8, 1996.

Nolan, P.D. et al., "Molecularly chemisorbed intermediates to oxygen adsorption on Pt(111): A molecular beam and electron energy-loss spectroscopy study," Journal of Chemical Physics, vol. 111, No. 8, pp. 3696-3704, Aug. 22, 1999.

Nolan, P. D. et al., "Translation Energy Selection of Molecular Precursors to Oxygen Adsorption of Pt (111)," Physical Review Letters, vol. 81, No. 15, pp. 3179-3182, Oct. 12, 1998.

Murphy, M. J. et al., "Inverted vibrational distributions from N2 recombination at Ru(001); Evidence for a metastable molecular chemisorption well," Journal of Chemical Physics, vol. 110, No. 14, pp. 6954-6962, Apr. 8, 1999.

Kim, M. S. et al., "Reaction of Gas-Phase Atomic Hydrogen with Chemisorbed Hydrogen Atoms on an Iron Surface," Bull. Korean Chem. Soc., vol. 18, No. 9, pp. 985-994, May 22, 1997.

Bonn, M. et al., "Phonon-Versus Electron-Mediated Desorption and Oxidation of CO on Ru(0001)," Science, vol. 285, pp. 1042-1045, Aug. 13, 1999. www.sciencemag.org.

Nolan, P. D. et al., "Direct verification of a high-translational-energy molecular precursor to oxygen dissociation on Pd(111)," Surface Science Letters, vol. 419, pp. L107-L113, Sep. 24, 1998.

Davis, J. E. et al., "Kinetics and dynamics of the dissociative chemisorption of oxygen on Ir(111)," Journal of Chem. Phys., vol. 107(3), pp. 943-952, Jul. 15, 1997.

Tripa, C. Emil et al., "Surface-aligned reaction of photo-generated oxygen atoms with carbon monoxide targets," Nature, vol. 398, pp. 591-593, Apr. 15, 1999, www.nature.com.

Shin HK, "Vibrationally excited OD Radicals from the Reaction of Oxygen-Atoms with Chemisorbed Deuterium on TUNGSTEN," Journals of Physical Chemistry, vol. 102(#13), pp. 2372-2380, Mar. 26, 1998.

Tripa, C. Emil et al., "Kinetics measurements of CO photo-oxidation on Pt(111)," Journal of Chemical Physics, vol. 105, Issue 4, pp. 1691-1696, Jul. 22, 1996.

G.H. Takaoka et al., "Preparation and catalytic activity of nanoscale An islands supported on TiO2", Nuclear Instruments & Methods in Physics Research, Section-B: Beam Interactions with Materials and Atoms, North-Holland Publishing Company, Amsterdam, NL, vol. 121, No. 1, 1997, pp. 503-506, XP004057973, abstract.

P. Avouris et al., "Electron-Stimulated Catalysis Device", IBM Technical Disclosure Bulletin, vol. 25, No. 12, May 1, 1983, pp. 6378-6379, New York, US, XP002219954.

"Electron-hole pair creation by reactions at metal surfaces", downloaded from www.aps.org/meet/CENT99/BAPS/abs7S6980001.html American Physical Society Centennial Meeting Program, Atalanta, GA, Mar. 20-26, 1999.

"Electron-Hole Pair Creation at Ag and Cu Surfaces by Adsorption of Atomic Hydrogen and Deuterium", Physical Review Letters, vol. 82, No. 2, Jan. 11, 1999.

"The Solarex Guide to Solar Electricity" Solarex Corporation, Inc. Frederich, MD, pp. 66-67, Apr. 1979.

Frese, et al., "Analysis of Current/Voltage Curves at n-Si/SiO$_2$/Pt Electrodes", J. Electrochem. Soc., Dec. 1994, pp. 3375-3382, vol. 141, No. 12, The Electrochemical Society, Inc.

Frese, et al., "Methanol Oxidation at p-Si/Pt Electrodes, Evidence for Hot Hole Reactivity", J. Phys. Chem., 1995, pp. 6074-6083, vol. 99, American Chemical Society.

Gadzuk, "Multiple Electron Processes in Hot-Electron Femtochemistry at Surfaces", http://www.cstl.nist.gov/div837/837.03/highlite/gadzuk1999.htm, (1999).

Frese, et al., "Hot Electron Reduction at Etched n-Si/Pt Thin Film Electrodes", J. Electrochem. Soc., Sep. 1994, pp. 2402-2409, vol. 103, The Electrochemical Society Inc.

Gaillard, et al., "Hot Electron Generation in Aqueous Solution at Oxide-Covered Tantalum Electrodes, Reduction of Methylpyridinium and Electrogenerated Chemiluminescence of Ru(bpy)$_3^{2+}$", J. Phys. Chem., 1999, pp. 667-674, vol. 103, American Chemical Society.

Sung, et al., "Demonstration of Electrochemical Generation of Solution-Phase Hot Electrons at Oxide-Covered Tantalum Electrodes by Direct Electrogenerated Chemiluminescence", J. Phys. Chem., 1998, pp. 9797-9805, vol. 102, American Chemical Society.

Zhdanov, et al., "Substrate-mediated photoinduced chemical reactions on ultrathin metal films", Surface Science, 1999, pp. L599-L603, vol. 432, Elsevier Science B.V.

Mahan, G. D. et al., "Multilayer thermionic refrigerator and generator," Journal of Applied Physics, vol. 83, No. 9, May 1, 1998.

Stipe, B. C. et al., "Atomistic studies of O2 dissociation on Pt(111) induced by photons, electrons, and by heating," J. of Chem. Phys., vol. 107 (16), Oct. 22, 1997, pp. 6443-6447.

Tripa, C. E. et al., "Surface-aligned reaction of photogenerated oxygen atoms with carbon monoxide targets," Nature, vol. 398, Apr. 15, 1999, pp. 591-593.

Bonn, M. et al., "Phonon-Versus Electron-Mediate Desorption and Oxidation of CO on Ru(0001)," Science, vol. 285, No. 5430, Issue of Aug. 13, 1999, pp. 1042-1045.

Davis, J. E. et al., "Kinetics and dynamics of the dissociative chemisorption of oxygen on Ir(111)," J. Chem. Phys., 107 No. 3, Jul. 15, 1997, pp. 943-951.

Gadzuk, J. W., "Hot-electron femtochemistry at surfaces: on the role of multiple electron processes in desorption," Chemical Physics, vol. 251, year 2000, pp. 87-97.

Gadzuk, J. W., "Resonance-assisted hot electron femtochemistry at surfaces," Physical Review Letters, May 27, 1996, vol. 76, Issue 22, pp. 4234-4237.

Ge, N.-H. et al., "Femtosecond Dynamics of Electron Localization at Interfaces," Science, vol. 279, No. 5348, Issue of Jan. 9, 1998, pp. 202-205.

Gao, Shiwu, "Quantum kinetic theory of vibrational heating and bond breaking by hot electrons," Physical Review B, vol. 55, No. 3, Jan. 15, 1997-I, pp. 1876-1886.

Hou, H. et al., "Enhanced Reactivity of Highly Vibrationally Excited Molecules on Metal Surfaces," Science, vol. 284, No. 5420, Issue of Jun. 4, 1999, pp. 1647-1650.

Nienhaus, H. et al., "Direct detection of electron hole pairs generated by chemical reactions on metal surfaces," Surface Science 445 (2000) pp. 335-342.

Nienhaus, H. et al., "Selective H atom sensors using ultrathin Ag/Si Schottky diodes," Applied Physics Letters, Jun. 28, 1999, vol. 74, Issue 26, pp. 4046-4048.

Gaillard, Frederic et al., "Hot electron generation in aqueous solution at oxide-covered tantalum electrodes, Reduction of methylpyridinium and electrogenerated chemiluminescence of Ru(bpy) 32+," Journal of Physical Chemistry B., vol. 103, No. 4, Jan. 28, 1999, pp. 667-674.

Engstrom, Ulrika and Ryberg, Roger, "Comparing the vibrational properties of low-energy modes of a molecular and an atomic adsorption: CO and O on Pt (111)," Journal of Chemical Physics, vol. 112, No. 4, Jan. 22, 2000, pp. 1959-1965.

Nolan, P. D. et al., "Molecularly chemisorbed intermediates to oxygen adsorption on Pt ( 111 ): A molecular beam and electron energy-loss spectroscopy study," Journal Of Chemical Physics, vol. 111, No. 8, Aug. 22, 1999.

Nolan P. D. et al., "Direct verification of a high-translational-energy molecular precursor to oxygen dissociation on Pd(111)," Surface Science vol. 419, pp. L107-L113, Dec. 24, 1998.

Otto, Andreas et al., "Role of atomic scale roughness in hot electron chemistry," Journal of Physical Chemistry B, vol. 103, No. 14. Apr. 8, 1999, pp. 2696-2701.

Plihal, M. et al., "Role of intra-adsorbate Coulomb correlations in energy transfer at metal surfaces," Physical Review B, vol. 58, No. 4, Jul. 15, 1998, pp. 2191-2206.

Sung, Yung-Eun et al., "Enhancement of electrochemical hot electron injection into electrolyte solutions at oxide-covered tantalum electrodes by thin platinum films," Journal of Physical Chemistry B., vol. 102, No. 49, Dec. 3, 1998, pp. 9806-9811.

Zhdanov, V. P. et al., "Substrate-mediated photoinduced chemical reactions on ultrathin metal films," Surface Science, vol. 432 (#3), pp. L599-L603, Jul. 20, 1999.

Nienhaus, H., "Electron-hole pair creation by reactions at metal surfaces," American Physical Society, Centennial Meeting Program, Mar. 20-26, 1999, Atlanta, GA, Session SC33—Metal Surfaces: Adsorbates. http://www.aps.org/meet/CENT99/BAPS/.

Nienhaus, H et al., "Electron-Hole Pair Creation at Ag and Cu Surfaces by Adsorption of Atomic Hydrogen and Deuterium," Physical Review Letters, vol. 82, Issue 2, Jan. 11, 1999, pp. 446-449.

Diesing, D. et al., "Aluminium oxide tunnel junctions: influence of preparation technique, sample geometry and oxide thickness," Thin Solid Films, 342 (1999), pp. 282-290, received Feb. 26, 1998; accepted Sep. 11, 1998.

Agranovich, V. M. et al., "New concept for organic LEDs: non-radiative electronic energy transfer from semiconductor quantum well to organic overlayer", Elsevier Science, Synthetic Metals, 2001, vol. 116, pp. 349-351.

Achermann, M. et al., "Carrier dynamics around nano-scale Schottky contacts: a femtosecond near-field study", Applied Surface Science 7659 (2001) 1-4.

Aeschlimann, M. et al., "Competing nonradiative channels for hot electron induced surface photochemistry", Chemical Physics, Apr. 15, 1996, pp. 127-141, vol.: 205, Issue: 1-2.

Aeschlimann, M. et al., "Ultrafast electron dynamics in metals", The Ultrafast Surface Science Group, http://www.ilp.physik.uni-essen.de/aeschlimann/2y_photo.htm, date unknown.

Auerbach, D. et al., "Reagent Vibrational Excitation: A Key to Understanding Chemical Dynamics at Surfaces ?", abstract only, date unknown.

Balandin, A. et al., "Significant decrease of the lattice thermal conductivity due to phonon confinement in a free-standing semiconductor quantum well", Physical Review B, Jul. 15, 1998, vol. 58, Issue 3, pp. 1545-1549.

Balandin, A. et al., "Effect of phonon confinement on the thermoelectric figure of merit of quantum wells", Journal of Applied Physics, Dec. 1, 1998, vol. 84, Issue 11, pp. 6149-6153.

Chang, Y. et al., "Coherent phonon spectroscopy of GaAs surfaces using time-resolved second-harmonic generation", Chemical Physics, 251/1-3, pp. 283-308, (2000).

Chen,-C. et al., "Hot electron reduction at n-Si/Au thin film electrodes", Journal-of-the-Electrochemical-Society, vol. 139, Nov. 1992, pp. 3243-3249.

Choi, C.K. et al., "Ultrafast carrier dynamics in a highly excited GaN epilayer", Physical Review B, vol. 63, 115315, Mar. 15, 2001, 6 pages.

Debernardi, A. et al., "Anharmonic Phonon Lifetimes in Semiconductors from Density-Functional Perturbation Theory", Physical Review Letters, vol. 75, No. 9, Aug. 28, 1995, pp. 1819-1822.

Delfatti, N. et al., "Temperature-dependent electron-lattice thermalization in GaAs", Physical Review B, Feb. 15, 1999-I, vol. 59, No. 7, pp. 4576-4579.

Denzler, D.N., et al., "Surface femtochemistry: Ultrafast reaction dynamics driven by hot electron mediated reaction pathways", Femtochemistry and Femtobiology: Ultrafast Dynamics in Molecular Science, (World Scientific, 2002).

Diesing, D. et al., "Surface reactions with hot electrons and hot holes in metals", Surface Science, 331-333, 1995, pp. 289-293.

Driskill-Smith, A. A. G. et al., "The nanotriode: A nanoscale field-emission tube", Applied Physics Letters, Nov. 1, 1999, vol. 75, Issue 18, pp. 2848-2847.

Fan, C. Y. et al., "The oxidation of CO on RuO2-110—at room temperature", Journal of Chemical Physics, vol. 114, No. 22, Jun. 8, 2001, p. 10058.

Frese, K.W., Jr. et al., "Hot electron reduction at etched n-Si/Pt thin film electrodes", Journal-of-the-Electrochemical-Society, vol. 141, Sep. 1994, pp. 2402-2409.

Funk, S. et al., "Desorption of CO from Ru-001—induced by near-infrared femtosecond laser pulses", Journal of Chemical Physics, vol. 112, No. 22, Jun. 8, 2000, pp. 9888-9897.

Gadzuk, J. W., "Resonance-assisted hot electron femtochemistry at surfaces", Physical Review Letters, May 27, 1996, vol. 76, Issue 22, pp. 4234-4237.

Gadzuk, J. W., "Multiple Electron Processes in Hot-Electron Femtochemistry at Surfaces" http://www.cstl.nist.gov/div837/837.03/highlite/gadzuk1999.htm, (1999).

Gadzuk, J. W., "Surface Femtochemistry with Fast Lasers and Slow Nanostructures", http://www.cstl.nist.gov/div837/837.03/highlite/previous/dietmin.htm, date unknown.

Gaillard, F. et al., "Hot electron generation in aqueous solution at oxide-covered tantalum electrodes. Reduction of methylpryidinium and electrogenerated chemiluminescence of Ru(bpy)32+", Journal of Physical Chemistry B. vol. 103, No. 4, Jan. 28, 1999, pp. 667-674.

Gao, S., "Quantum kinetic theory of vibrational heating and bond breaking by hot electrons", Physical Review B, vol. 55, No. 3, Jan. 15, 1997-I, pp. 1876-1886.

Gergen, B. et al., "Chemically Induced Electronic Excitations at Metal Surfaces", Science, vol. 294, No. 5551, Issue of Dec. 21, 2001, pp. 2521-2523.

Guo, J. et al., "The desorption yield dependence on wavelength of femtosecond laser from CO/Cu(111)", Annual Meeting of the American Physical Society, Mar. 1999, Atlanta, GA; Session BC18—Surfaces (General), ORAL session, Mar. 21; Room 258W, GWCC [BC18.06].

Hess, S. et al., "Hot Carrier Relaxation by Extreme Electron—LO Phonon Scattering in GaN", http://www.physics.ax.ac.uk/rtaylor/images/hot%20carrier%20poster.pdf, date unknown.

Hofer, U., "Self-Trapping of Electrons at Surfaces", Science, vol. 279, No. 5348, Issue of Jan. 9, 1998, pp. 190-191.

Katz, G. et al., "A theoretical study of hole induced desorption", Journal of Chemical Physics, Oct. 22, 1999, vol. 111, Issue 16, pp. 7593-7598.

Lee, B. C. et al., "Transmission of longitudinal optical phonons through a barrier in uniaxial crystals", Physical Review B, vol. 65, 153315, Apr. 15, 2002.

NANOLITE, "NANOLITE Sparkflashlamp", http://www.hsps.com/products/nanolaen.htm, date unknown.

Nienhaus, H., "Electronic excitations by chemical reations on metal surfaces", Surface Science Reports, 45, (2002), pp. 1-78.

Plihal, M. et al., "Role of intra-adsorbate Coulomb correlations in energy transfer at metal surfaces", Physical Review B, Jul. 15, 1998, vol. 58, Issue 4, pp. 2191-2206.

Pontius, N. et al., "Size-dependent hot-electron dynamics in small Pd-clusters", Journal of Chemical Physics, Dec. 8, 2001, vol. 115, Issue 22, pp. 10479-10483.

Prybyla, J. A. et al., "Femtosecond time-resolved surface reaction: Desorption of CO from Cu(111) in <325 fsec", Physical Review Letters; Jan. 27, 1992, vol. 68, Issue 4, pp. 503-506.

Rinnemo, M., "Catalytic Ignition and Kinetic Phase Transitions", http://www2.lib.chalmers.se/cth/diss/doc/9596/RinnemoMats.html, date unknown.

Saalfrank, P. et al., "Quantum dynamics of bond breaking in a dissipative environment: Indirect and direct photodesorption of neutrals from metals", J. Chem. Phys. 105 (6), Aug. 8, 1996, pp. 2441-2454.

Sung,-Y.-E., et al., "Enhancement of electrochemical hot electron injection into electrolyte solutions at oxide-covered tantalum electrode by thin platinum films", Journal of Physical Chemistry B., vol. 102, No. 49, Dec. 3, 1998, pp. 9806-9811.

White, J. M., "Using photons and electrons to drive surface chemical reactions", Journal of Molecular Catalysis A: Chemical 131, 1998, pp. 71-90.

Zhdanov, V.P. et al., "Substrate-mediated photoinduced chemical reactions on ultrathin metal films", Surface Science, vol. 432 (#3), pp. L599-L603, Jul. 20, 1999.

Zhu, X.-Y., "Surface photochemistry: from hot reactions to hot materials", Surface Science, vol. 390, (1997), pp. 224-236.

Daniel J. Auerbach, Hitting the Surface Softly, www.sciencemag.org, vol. 294 Science, Dec. 21, 2001, pp. 2488-2489.

M.D Cummings and A.Y Ele Zzabi, Ultrafast impulsive excitation of coherent longitudal acoustic phonon oscillations in highly photoexcited InSb, 2001 American Institute of Physics, vol. 79, No. 6, Aug. 6, 2001.

J.W. Gadzuk, Resonance-Assisted Hot Electron Femtochemistry at Surfaces, National Institute of Standards and Technology, Gathersburg, Maryland 20899, Physical Review Letters, vol. 76, No. 22, May 27, 1996.

Brian Gergen, Herman Nienhaus, W., Henry Weinberg, Eric W. McFarland, Chemically Induced Electronic Excitations at Metal Surfaces, www.sciencemag.org, vol. 294, Dec. 21, 2001, pp. 2521-2523.

H.Hou, Y.Huang, S.J. Guilding, C.T Rettner, D.J. Auerbach, A.M. Woodtke, Enhanced Reactivity of Highly Vibrationally Excited Molecules on Metal Surfaces, www.sciencemag.org, vol. 284, Jun. 4, 1999, pp. 1647-1650.

Y.Huang, C.T Rettner, D.J. Auerbach, A.M. Woodtke, Vibrational Promotion of Electron Transfer, sciencemag.org, vol. 290, Oct. 6, 2000, pp. 111-114.

Steven P. Lewis, Andrew M. Rappe, Controlling adsobate vibrational lifetimes using superlattices, 2001 The American Physical Society, Physical Review B, Bolume 63, 085402.

Henry Weinberg, Eric W. McFarland, A. Majundar, B. Gergen, Herman Nienhaus, W.,H.S Bergh, Electron-Hole Pair Creation at Af and Cu Surfaces by Adsorption of Atomic Hydrogen and Deuterium, 1999 The American Physical Society, Physical Review Letters, vol. 82.

Henry Weinberg, Eric W. McFarland, A. Majundar, B. Gergen, Herman Nienhaus, W.,H.S Bergh, Direct detection of electron-hole pairs generated by vhemical reactions on metal surfaces, 2000 Elsevier Science B. V., Surface Science, pp. 335-342.

Xiaofeng, Fan, Gehong, Chris Labounty, and Bowers, John E., Croke, Edward Ahn, Channing C., Huxtable, Scott, Majundar, Arun, Shakouri, Ali; SiGec/Si superlattice microcoolers; Applied Phusics Letters, vol. 78, No. 11, Mar. 12, 2001, p. 1508-1582.

Friedman, L., Sun G., Soref, R.A.; SiGec/Si Thz laser based on transitions between inverted mass light-hole and heavy-hole subbnads; Applied Physics Lettersl; vol. 78, No. 4, Jan. 22, 2001; p. 401-403.

Harrison, P., Soref, R.A.; Population-inversion and gain estimates for semiconductor TASER.

Harrison, P., Soref, R.A.; Room temperature population inversion in SiGe TASER design.

Hohlfeld, J., Wellershoff, S.-S, J., Gudde, U., Conrad, V., Jahnke, E., Mattias; Electron and lattice dynamics following optical excitation of metals; Chemical Physics 251(2000), p. 237-258.

Hou, H., Huang, Y., Goulding, S.J., Retter, C.T., Auerbach, D.J., Wodrke, A.M.; Dierect multiquantum relaxation of highly vibrationally excited NO in collisions with O/Cu(111), Journal of Chemical Physics vol. 110(22) p. 10660, (1999).

Jongma, Rienk T., Wodtke, Alec M.; Fast multiquantum vibrational relaxation of highly vibrationally excited O2; Journal of Chemical Physics; vol. 111, No. 24; Dec. 22, 1999; pp. 10957-10963.

Kawakami, R.K., Rotenberg, E., Choi, Hyuk J., Escorcia-Aparicio, Ernesto J., Bowen, M.O., Wolfe, J.H., Arenholz, E., Zhang, Z.D., Smith, N.V., Qiu, Z.Q., Quantum-well states in copper thin films; Letters to nature; vol. 398; Mar. 11, 1999; www.nature.com.

MD. Golam Moula, Surgio Wako, Gengyu Cao, Ivan Kobal, Yuichi Ohno, Tatsuo Matsushima; Velocity distribution of desorbin CO2 in CO oxidation ion Pd(110) under steady-state conditions; applied surface science; 169-170 (2001); pp. 268-272.

Jean-Philippe Mulet, Karl Joulain, Remi Carminati, and Jean-Jacques Greffet; Nanoscale radiative heat transfer between a small particle and a plane surface; Applied Physics Letters; vol. 78, No. 19; May 7, 2001; pp. 2931-2933.

H. Nienhaous et al., "Direct detection of electron-hole pairs generated by chemical reaction on metal surfaces", Surface Science 445 (2000), pp. 3350342.

H. Nienhaus et al., "Selective H atom sensors using ultrathin Ag/Si Schottky diodes", Applied Physics Letters, vol. 74, No. 26, Jun. 28, 1999, pp. 4046-4048.

J.J Paggel et al., "Quantum-Well States as a Fabry-Perot Modes in a Thin-Film Electron Interferometer", www.Sciencemag.org Science vol. 284 Mar. 12, 1999, pp. 1709-1711.

J.J Paggel et al., "Quasiparticle Lifetime in Macroscopically Uniform Ag/Fe(100) Quantum Wells", Physical Review Letters, vol. 81, No. 25, Dec. 21, 1998, pp. 5632-5635.

J.J Paggel et al., Quantum well photoemission from atomically uniform Ag films: determination of electronic band structure and quasi particle lifetime in Ag(100), Aplied Surface Science 162-163(2000), pp. 78-85.

N. Pontius et al., "Size-dependent hot-electron dynamics in small Pdn-cluster", Journal of Chemical Physics, vol. 115, No. 22, Dec. 8, 2001, pp. 10479-10483.

R.A Sorel et al., Terahertz gain in a SiGe/Si quantum staircase utilizing the heavy-hole inverted effective mass, Applied Phusics Letters, vol. 79, No. 22, Nov. 26, 2001, pp. 3639-3641.

G. Sun et al., Phonon-pumped terahertz gain in n-type GaAs/AlGaAs Superlattices, Applied Physics Letters, vol. 78, No. 22, pp. 3520-3522.

V. P. Zhdanov et al., "Substrate-mediated photoinduced chemical reations on ultrathin metal films", Surface Sciene 432 (1999), pp. L599-L603.

H. Park et al., "Nanomechanical oscillations in a single-C60 transistor", Letters to nature, vol. 407, Sep. 7, 2000, www.nature.com, pp. 57-60.

G. Sun et al., "Phonon Pumped SiGe/Si Interminiband Terahertz Laser", pp. 1-11, date unknown.

G. Sun et al., "Phonon-pumped terahertz gain in n-type GaAs/Al GaAs superlattices", Applied Physics Letters, vol. 78, No. 22, May 28, 2001, pp. 3520-3522.

K. Svensson et al., "Dipole Active Vibrational Motion in the Physisorption Well", Physical Review Letters, vol. 78, No. 10, Mar. 10, 1997, pp. 2016-2019.

R. D. Vale et al., "The Way Things Move: Looking Under the Hood of Molecular Motor Proteins", Science, vol. 288, Apr. 7, 2000, www.sciencemag.org, pp. 88-95.

W. Xu et al., Electrical generation of terahertz electromagnetic pulses by hot-electrons in quantum wells, Superlattices and Microstructures, vol. 22, Nov. 1, 1997, pp. 25-29.

G. Sun, R.A. Soref, J.B. Khurgin; "Phonon Pumped SiGe/Si Interminiband Terahertz Laser", date unknown.

P. Armour et al., "Hot-electron transmission through metal—metal interfaces: a study of Au/Fe/Au trilayers in GaAs substrates", Applied Surface Science 123/124 (1998), pp. 412-417.

C.D. Bezant et al., "Intersubband relaxation lifetimes in p-GaAs/AlGaAs quantum wells below the LO-phonon energy measured in a free electron laser experiment", Vacuum Solutions Online, Semicond. Sci. Technol. 14 No. 8 (Aug. 1999) L25-L28, PII: S0268-1242(99)03669-X.

L. Burgi et al., "Confinement of Surface State Electrons in Fabry-Perot Resonators", Physical Review Letters, vol. 81, No. 24, Dec. 14, 1998, pp. 5370-5373.

I. Campillo et al., "Inelastic lifetimes of hot electrons in real metals", Physical Review Letters, vol. 83, No. 11, Sep. 13, 1999, pp. 2230-2233.

Chiang, T.-C., "Photoemission studies of quantum well states in thin films", Surface Science Reports 39 (2000) pp. 181-235.

De Paula, A. et al, "Carrier capture processes in semiconductor superlattices due to emission of confined phonons", J. Appl. Phys. 77 (12), 1995 pp. 6306-6312.

* cited by examiner

QUANTUM WELL ENERGIZING METHOD AND APPARATUS

CROSS REFERENCE TO RELATED APPLICATION(S)

This application claims priority to U.S. provisional patent application No. 60/302,274 entitled "Quantum Well Energizer," which was filed on Jun. 29, 2001 and is hereby incorporated by reference. This application also relates to U.S. Pat. No. 6,114,620 entitled "Pre-Equilibrium Chemical Reaction Energy Converter," which was filed on May 4, 1999 and is hereby incorporated by reference.

BACKGROUND

Quantum wells are solid state electronic devices that are well known in the art. Among other things, quantum wells can be used to form light emitting diodes (LEDs), semiconductor lasers, and other tunneling devices. An representative example of a quantum well structure is depicted in FIG. 7. In FIG. 7, a quantum well structure 700 is depicted as comprising a substrate 705 and a plurality of alternating layers 710, (X and Y). Each of these alternating layers, X and Y, comprises a different composition of semiconductor material, thereby creating alternating band-gap diagrams. Although the quantum well structure 700 in FIG. 7 is depicted as comprising multiple layers, it is well known in the art that a quantum well structure may be comprised of a several hundred layers, or only one alternating layer, forming a single quantum well. Although it is usually preferable to use as many quantum wells in a quantum well layer as possible, the cost of fabrication can limit the number of quantum well that can be economically incorporated into the device. The thickness and composition of the alternating layers in a quantum well structure can be varied to produce a variety of other effects. A representative depiction of the alternating band-gap diagrams created by the alternating semiconductor layers 710 is illustrated in FIG. 8.

In FIG. 8, the band gap for each of the layers alternates between a large band gap $E_1$, which corresponds to the band gap of material X, and a smaller band gap $E_2$, which corresponds to the band gap of material Y. The juxtaposition of these two layers at very small dimensions causes the distance between the conduction band Fermi level and the valence band Fermi level in material Y to be widened from energy level $E_2$ to energy level $E_3$. This widening allows the quantum well to perform as if it were operating as a different kind of material with a wider band-gap. Accordingly, when properly pumped and stimulated, quantum well devices can emit light at wavelengths that would not normally be associated with typical semiconductor materials. These devices can therefore provide great utility for a wide variety electronic devices.

One problem associated with existing quantum well structures relates to how the quantum well is energized (i.e. pumped). Existing methods for energizing a quantum include applying an electric field across the quantum well, optically pumping the well with photons of sufficient energy (i.e. wavelength), and thermally pumping the well with a heat source and a cold sink to induce a population inversion. These methods are undesirable because they require a step of converting primary energy into an intermediate energy source, such as optical energy, electrical energy, or thermal energy. There is therefore a need in the art for a method and apparatus for directly energizing a quantum well with a primary energy source. By directly energizing a quantum well with a primary energy source, the intermediate step of energy conversion can be eliminated, thus reducing the complexity of the system and improving its efficiency.

BRIEF SUMMARY

The disclosed method and apparatus utilizes a chemical reaction as a primary energy source to energize a quantum well structure. Chemical reactions that occur on or near a surface of a conductor or catalyst will emit hot electrons and hot phonons into the catalyst. It has been determined that a substantial fraction of the energy released during certain chemical reactions can be directly transferred into an adjacent quantum well structure before that energy is converted into heat. This transfer of energy utilizes two modes: hot electrons and hot phonons. Both of these energy transfer modes are effective to pump or energize the quantum wells. The disclosed method and apparatus utilizes a structure that is a combination of a catalyst layer and an interface layer that are disposed adjacent to a quantum well device. The catalyst layer catalyzes a chemical reaction on its upper surface and captures the phonons or hot electrons generated by the chemical reaction. The interface layer is disposed between the catalyst layer and the quantum well and facilitates the transfer of the captured phonons and hot electrons into the quantum well layer. The distance between the chemical energy source and a quantum well is preferably limited to a dimension less than 5 times the energy diffusion length of the phonons or hot electrons. Accordingly, the dimensions of the catalyst layer, interface layers, and the quantum wells are very thin. In order to improve the efficiency of the disclosed method and apparatus, the interface layer(s) between the catalyst layer and the quantum well can facilitate the conversion of hot electron energy into desired phonon modes, especially longitudinal optical modes. The interface layers may also be arranged to convert phonons into hot electrons, as the need arises.

DETAILED DESCRIPTION

The disclosed method and apparatus relates to a structure for catalyzing a chemical reaction to provide hot electrons and hot phonons to energize a quantum well structure. Chemical reactions that occur on or near a surface, such as a conductor or catalyst, will emit hot electrons and hot phonons into the catalyst. It has been determined that a substantial fraction of the energy released during certain chemical reactions can be directly transferred into a quantum well structure before that energy is converted into heat. Our theoretical models have indicated that a majority of the energy produced by a chemical reaction can be used to energize a quantum well, depending upon the specific device characteristics. The transfer of energy from the chemical reaction to the quantum well utilizes two transfer modes: hot electrons and hot phonons. Both of these energy transfer modes are effective to pump or energize the quantum wells with charge carriers.

The disclosed apparatus and method uses a catalyst layer and one or more interface layers to produce hot phonons or hot electrons that can be injected directly into a quantum well. To accomplish this task, the distance between the chemical reaction site and the quantum well is preferably less than 5 times the energy diffusion length of the phonons or electrons.

A variety of factors may be considered when selecting and arranging the materials of the disclosed apparatus, such as the electronic properties, phonon band properties, crystal structure, and the lattice constant of the substrate, interface layers, and the quantum well. Furthermore, the electrochemical properties of the catalyst layer and its relationship to the interface layers can affect the selection of the composition and dimensions of the catalyst layer. Another aspect of the invention relates to the selection of reactants to produce the hot electrons or phonons in the chemical reaction.

Figure 1:
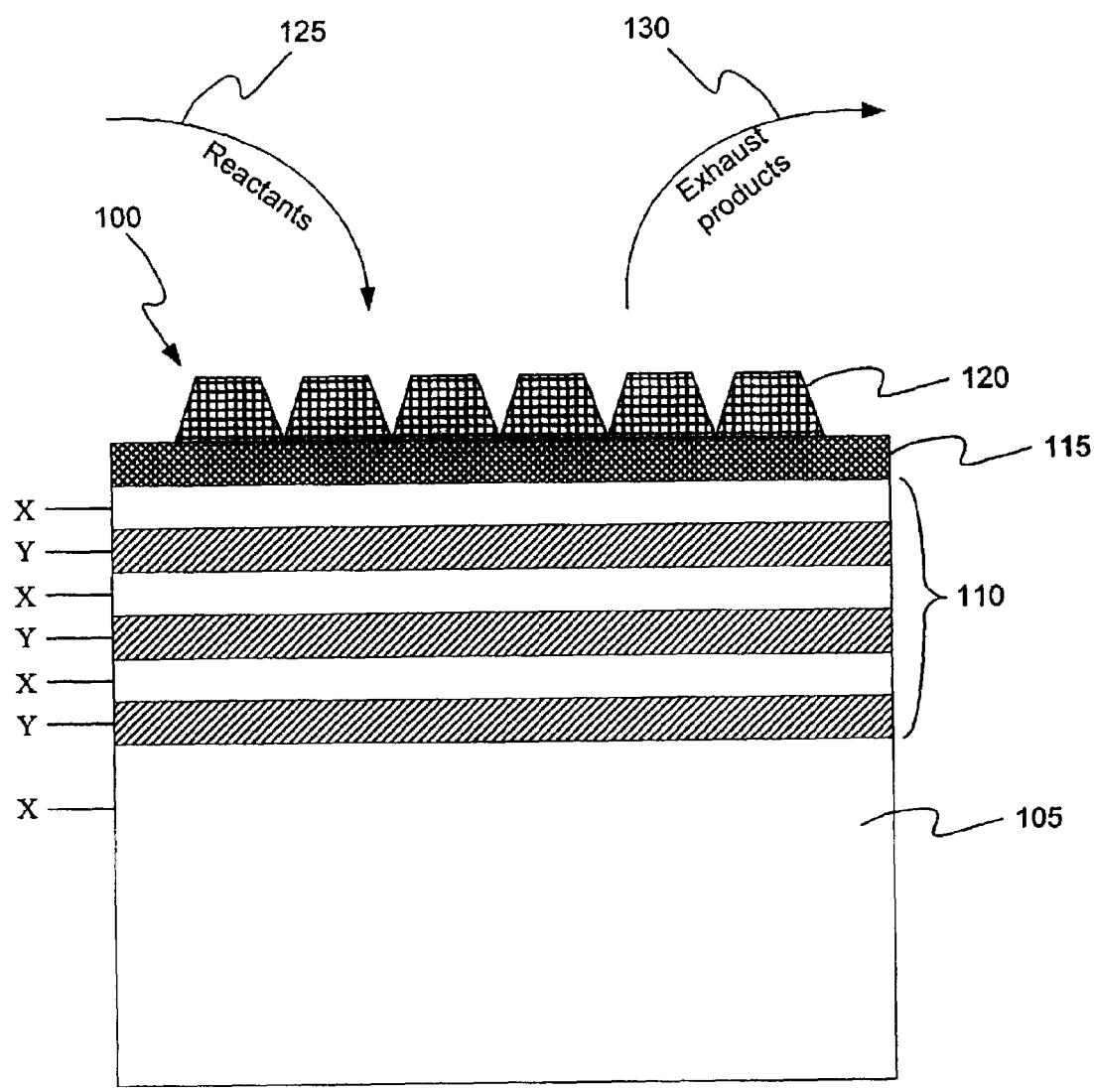
FIG. 1 is a cross-sectional diagram of one embodiment of a quantum well energizing apparatus suitable for use with the disclosed invention.

A representative embodiment of a quantum well energizing apparatus 100 suitable for use with the invention is depicted in FIG. 1. In FIG. 1, a quantum well energizing apparatus 100 is depicted as comprising an interface layer 115, and a catalyst 120. Also depicted in FIG. 1 are a substrate portion 105, a quantum well layer 110. The interface portion 115 may comprise any of a variety of semiconductor-related materials, including, for example, Silicon, Aluminum, Antimony, Gallium Arsenide, Indium Phosphide, and any combination thereof. According to a preferred embodiment, the interface layer 115 comprises type IV, III–V, or II–VI compositions such as Silicon, Gallium Arsenide (GaAs), Gallium Nitride (GaN), Gallium Phosphide (GaP) and SiC. For purposes of illustration, however, the interface layer 115 will be referred to as comprising material X. Disposed adjacent to the interface layer 115 is one or more quantum well structures 110. In FIG. 1, six alternating layers are depicted as comprising material X and Y. As described above, the composition and thickness of these alternating layers are selected so that the band-gaps of each respective layer form one or more quantum wells.

An important feature of the interface layer 115 is its ability to convert hot phonons and hot electrons into energy forms suitable for charging the quantum well. In particular, it is desirable for an interface layer 115 to be able to convert hot phonons into energetic carriers, also known as electron hole pairs (EHPs), that can be stored in the quantum well. This kind of energy conversion is known as phonon coupling. Examples of semiconductor materials that exhibit favorable phonon coupling properties include GaN, SiN, SiC, GaAs, AlAs, and the family $In_xGa_yAs_zSb_w$. According to a preferred embodiment, material X comprises Gallium Nitride and material Y comprises a mixture of Gallium Nitride and Aluminum ($Al_xGa_yN$). Other pairs of semiconductor layers that may function as interface layers include, for example:

$GaAs/Al_x$ and $Ga_xAs_{1-x}$;
$Al_{1-x}Ga_xN$ and AlN;
$Al_{1-x}Ga_xSb$ and AlSb;
$ZnS_{1-x}Se_x$ and ZnS; and
$Si_{1-x}Ge_x$ and Si.

According to a preferred embodiment, the following compounds can also be used for the interface layer: $GaAs/Al_{0.15}$ and $Ga_{0.85}As_{0.15}$ or $Si_{0.97}Ge_{0.03}$ and Si. Materials such as Pb and diamond, with vastly different phonon bands and conductivity properties, for example, may also be used in the interface layers. Pb and diamond are representative of the extreme of physical properties and show that any material may be considered a candidate material for these purposes. Bipolar semiconductor materials composed of elements of different masses and crystal structures (e.g. wurtzite and zinc-blende) may be used, such as alloys and III–V and II—VI semiconductor compounds. Accordingly, a wide variety of compositions and thickness may be selected to provide for a desirable balance between bandgap differential, crystal dimensions, lattice constants and phonon-EHP coupling. The compositions described above may also be used to form the substrate layer 105.

A quantum well interface layer 115 is placed adjacent to the quantum well structures 110. The quantum well interface 115 is used to match the material and electronic properties of the catalyst layer 120, or another interface layer, with the quantum well 110. The quantum well interface layer 115 is also used to convert and tailor phonon or carrier energies to make them useful in the quantum well. In addition, the materials comprising the quantum well interface can be used to convert hot electrons or hot phonons into the desired energy mode. In this manner, the efficiency of the process can be improved. According to one embodiment, the quantum well interface 115 comprises a composition of Gallium Nitride (GaN) or Aluminum Gallium Nitride ($Al_xGa_yN$). It is known that these compositions have strong hot electron—phonon coupling and therefore will convert a large number of the hot electrons passing through it into phonons. Another purpose served by the quantum well interface 115 is to match the electrical and structural properties of the quantum well devices with the catalyst layer 120, or other adjacent interface layer. The thickness of the quantum well interface layer 115 is limited by the mean free path of the energy modes passing therethrough. Specifically, the intermediate layers should be arranged such that the distance from the catalyst surface 120 to the quantum well layer 110 is less than about five times the energy mean free path.

The catalyst 120 comprises a layer of metal, semiconductor or insulator that catalyzes a chemical reaction on its surface. A wide variety of materials have been found suitable as catalysts 120 including, for example, aluminum, platinum, palladium, rhodium, ruthenium, and transition metals. Insulating materials, such as $RuO_2$, Alumina ($Al_2O_3$), Titania ($TiO_x$), and Vanadia ($V_xO_y$), have also proven effective as catalyst layers. The insulating materials generally only produce hot phonons or hot holes during the chemical reaction. Accordingly, the mean free paths for these energy modes are much shorter than those for hot electrons. Other materials that form suitable catalysts include one to ten monolayers of Gold (Au) deposited on oxide insulators, such as Titania (TiO), Iron Oxide ($Fe_2O_3$), or $Co_3O_4$. The catalyst layer 120 is preferably arranged such that a plurality of clumps are present on the surface of the catalyst 120.

These clumps may take a variety of forms including, for example, islands, corrals, chaotic surface constructs, pyramids, layers, monolayers and monolayered islands. Each of these structures are formed with dimensions in the range of 0.3 to 20 nanometers. The lower boundary for this range, 0.3 nanometers, represents one monolayer (i.e. one atom) thickness for the catalyst. The upper boundary for this range, 20 nanometers, represents the upper end of the mean free path for hot electrons and hot phonons. 20 nanometers roughly corresponds to about 100 monolayers. The catalyst 120 catalyzes a chemical reaction so as to produce hot phonons and/or hot electrons. According to well-known chemical theory, these reactions are strongly catalyzed at the edges and corners of the catalyst structures 120. Thus, by increasing or decreasing the number and size of the edges in the catalyst structure 120, the degree to which the reaction is catalyzed can be adjusted.

Recent research has shown that during a brief time period after the catalyzation of a chemical reaction, charge carriers, such as hot electrons and hot phonons are emitted by the reaction. These emissions, also known as "pre-equilibrium" emissions, are captured by the catalyst layer 120 where they can be passed into the interface layer(s) 115 and eventually into the quantum well 110. These emissions are unstable and will readily transform into heat or other non-productive forms of energy in brief periods of time (tens of picoseconds or less). Accordingly, it is desirable that the catalyst layer 120 be located close to the quantum well layer 110 so that the emissions can be used to energize the quantum wells 110 before they degrade into heat.

Figure 2:
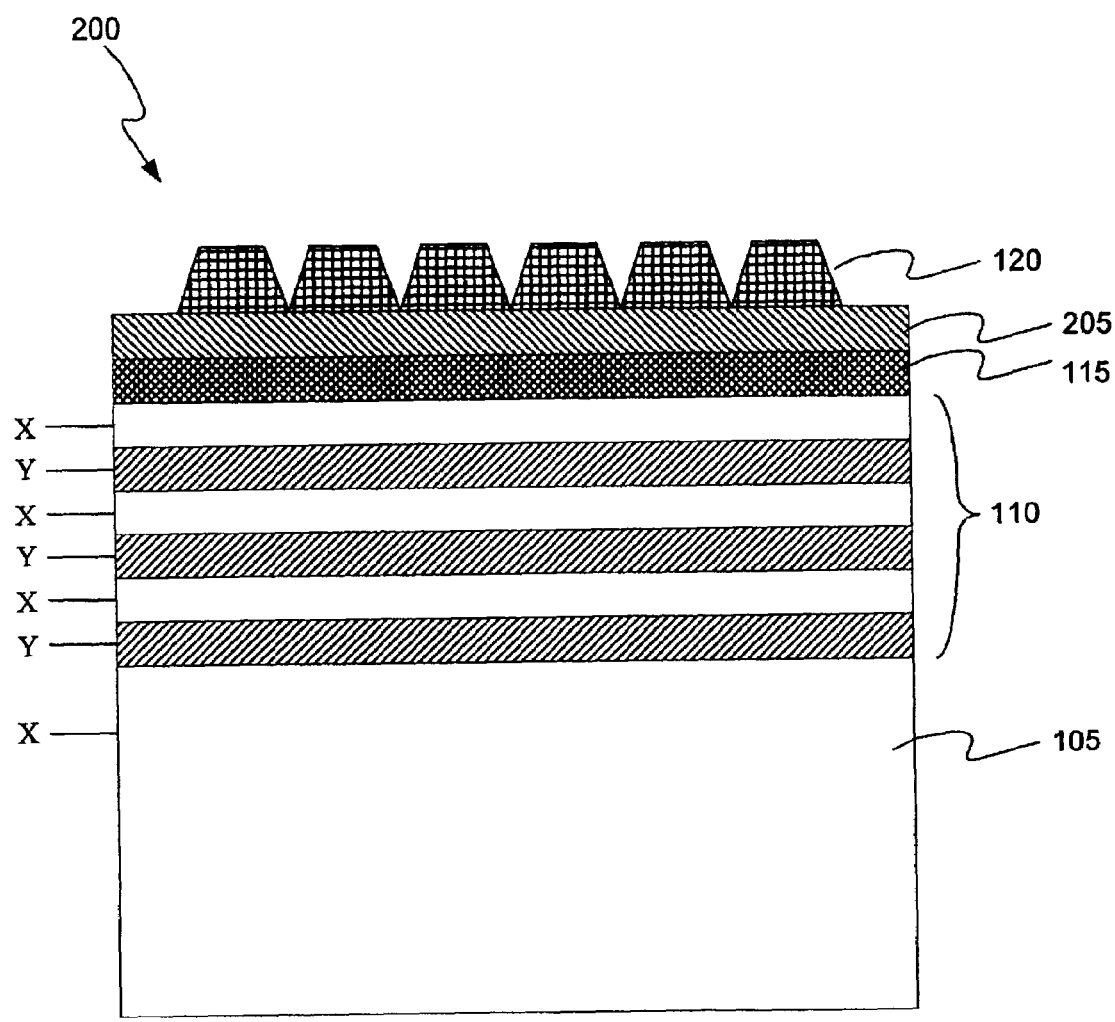
FIG. 2 is a cross-sectional diagram of an alternative embodiment of a quantum well energizing apparatus suitable for use with the disclosed invention.

An alternative embodiment of a quantum well energizing apparatus 200 is depicted in FIG. 2. Much like FIG. 1, the quantum well energizing apparatus 200 includes an interface layer 115, and a catalyst 120. The embodiment depicted in FIG. 2 also includes a substrate 105, a quantum well layer 110, and a catalyst interlayer 205. The catalyst interlayer 205 may be needed when the electrical and mechanical properties of the catalyst layer 120 do not match those of the quantum well interface 115. For example, in some embodiments, the material of the quantum well interface 115 comprises an alloy of Aluminum Gallium Nitride ($Al_xGa_yN$), which does not catalyze the desired reactions on its surface. On the other hand, the material of the catalyst 120 may be Platinum, which forms a Schottky barrier with the $Al_xGa_yN$ alloy and therefore may not efficiently transfer the emissions energy to the quantum well layer. To overcome these incompatibilities, a catalyst interlayer 205 comprising a metallic substance, such as Aluminum, can be placed between the catalyst 120 and the quantum well interface 115 so as to form an ohmic contact between with the $Al_xGa_yN$ alloy and the Platinum catalyst and thereby facilitate the injections of hot electrons and hot phonons into the quantum well. A catalyst interface layer (not shown in FIG. 2) may also be incorporated between the catalyst layer 120 and the catalyst interlayer 205, depending upon the materials and energy transfer modes utilized by the device. The catalyst interlayer 205, however, may only be needed to match the phonon coupling properties and the crystal structure properties of the catalyst layer 120 and the catalyst interlayer 205. Further alternative embodiments are contemplated for the disclosed invention, including an apparatus in which the catalyst interlayer 205, the catalyst interface 110, and the quantum well interface 115 are incorporated into a single layer. According to another embodiment, these interface layers can be superlattices formed from combinations of conductors, insulators and semiconductors.

The chemical reaction that occurs on the surface of the catalyst layer 120 includes intermediate reactions that form products that ultimately result in exhaust products. This concept is illustrated in FIG. 1, where reactants 125 are applied to the surface of the catalyst layer 120 and exhaust products 130 are discharged and removed from the surface of the catalyst layer 120. The process of removing exhaust products is important for two reasons. First, as exhaust products are removed from the surface of the catalyst 120, they permit additional reactants to be adsorbed on the catalyst surface 120, thereby ensuring that a continuous reaction occurs. Second, the removal of exhaust products from the surface of the catalyst 120 dissipates heat from the catalyst layer 120. Heat dissipation is important because the disclosed chemical reactions can generate as much as 10–100 watts/cm$^2$ on the surface of the catalyst layer 120.

The chemically excited products produced by the chemical reaction include intermediate reaction products, the exhaust products of chemical reactions, dissociated adsorbates, precursor states of adsorbates on a catalyst or conductor surface, hot atoms, and the adsorption reaction products of chemicals with a surface. Intermediate reactions also release pre-equilibrium hot electron-hole pairs (EHPs) and hot phonons. These emissions are known to energize phonon modes in the interface layer 115, the quantum well 110, and even the substrate 105.

The reactants that are applied to the catalyst 120 can include, for example, fuel and oxidizer mixtures, fuel—air mixtures, single component chemicals (i.e. monopropellants), and multicomponent mixtures such as fuel, oxidizer, air and additives. Additives include accelerants and oxidizers such as hydrogen peroxide. The excited state intermediate products may include compounds such as CO, OH, CHO, and $CH_2O$ and the exhaust products can include $H_2O$ and $CO_2$. The intermediate state products may also include other, non-reactive specie such as exhausts, and air molecules such as nitrogen or oxygen. These intermediates may acquire energy from the reactants and their byproducts.

Fuels for the chemical reaction can include reducing materials or electron donors, including, but not limited to, hydrogen, hydrocarbons, complex hydrocarbons, alcohols such as methanol, ethanol and propanol, carbohydrates, partially oxygenated hydrocarbons, diesel fuel, kerosene, volatized products of organic matter, the products of a fuel reformer such as hydrogen and carbon monoxide, and combustible gasses including ammonia. Oxidizers may include any one of electron acceptors, such as oxygen, air, hydrogen peroxide and halogens. According to another aspect, reactants, whether or not they are considered fuels and oxidizers, may also be used. Thus, any reaction that produces excited specie may be used as the source of energy. Other examples of reactants include such combinations as alkali metals and water, where the exhaust would include alkali oxides and hydrogen. Yet another example of reactants may include chemical reactants where the fuel and oxidizer are one and the same unstable molecule. Examples of such chemical reactants include monopropellants such as MMH, mono methyl hydrazine.

The term "chemical reaction" includes the adsorption of reactants on the catalyst surface 120. For example, on some catalyst materials such as platinum and palladium, fuel and oxidizer compositions may release a substantial fraction of their chemical energy in the form of heat of adsorption. This "heat" initially comprises hot electrons and hot phonons. On conductors, the hot electron energy release may occur during tens of femtoseconds and the hot phonon release during tens of picoseconds. The energy released by this reaction, however, is initially in a pre-equilibrium form and does not immediately thermalize or degrade into heat. The excited states of the reaction products also include electronic, vibrational and rotational energy of gas phase and adsorbed specie, frustrated rotation and translation states on surfaces, and vibrations against the surface. The excited states transfer energy to the quantum well through radiation, evanescent radiation, hot electrons, hot carriers and phonons. The energy released includes the hot phonons and hot electrons resulting from capture of hot atoms produced by surface reactions, including dissociation of adsorbates from precursor states, and including intermediate reactions producing hot atoms. The energy release associated with the chemical reactions includes the decay of vibrationally excited states of adsorbates immediately after being formed. This includes the case where the excited state chemicals are in the region immediately above the surface, such as 100 to 500 nm away (~5 to 10 gas collision diffusion lengths).

To form vibrationally excited specie via the Eley-Rideal process on the catalyst surface, chemically reactive free radicals, such as atomic hydrogen and oxygen, may be allowed to impinge on adsorbed oxygen or fuel on the catalyst surface. The atomic hydrogen and oxygen may be generated as intermediates of fuel/air reactions. Reactants may also form on the catalyst surface and react, for example, via Langmuir-Hinshelwood process. In one aspect, the energized molecules may be created by reacting fuels and air with the aid of catalysts and stimulators and by using reaction geometries that form excited gaseous molecules at any locations where they may readily migrate and diffuse to a quantum well energizer device surface before losing a substantial amount of excitation.

During operation, known stimulation devices such as catalysts, reaction stimulator methods, and additives may be used to produce excited specie after reactants enter a region of reaction. Stimulation of reactions concentrates the energy release, causing bursts of high temperature electrons and phonons to flood the underlying structures. When the stimulation pulses are sufficiently short, for example, less than about tens of picoseconds, the underlying structures are not heated during the pulse. This combination of hot phonon and or electrons with cool underlying structures is highly advantageous to the quantum well energizer operation.

The disclosed method and apparatus captures these pre-equilibrium energy modes and applies them to the quantum well structure before they are dissipated into heat. According to one embodiment, the energy transfer process also includes electromagnetic and evanescent electromagnetic radiation transferred from gas specie in a region near the catalyst, but not necessarily adjacent to it. For example, a region that is at least several energy diffusion lengths (and coincidentally several gas diffusion lengths) from the surface of the catalyst may be able to transfer energy into a quantum well structure. This distance can be described as the "near field," where evanescent coupling may dominate, and is typically less than a half wavelength of the radiation that will couple directly into the well. The shortest wavelength of such radiation corresponds to the maximum bond energy of chemical reactants, which is on the order of 2 electron volts. Such radiation therefore has a wavelength on the order of 500 nm. This implies that the shortest distance that would be required for a transfer of energy from a gas specie to a quantum well would be on the order of 250 nm. Most excited state chemical radiation has wavelengths between 1500 and 15,000 nanometers. Half of this, between 700 and 7000 nanometers, represents a measure of the upper limit of the distance. The radiation transfer mechanism described above may be enhanced by enclosure in an electromagnetic or optical cavity.

The transfer of energy into the quantum well also includes creation of hot electrons. Hot electron creation between gas and conducting surface is known in the art as an "electron jump" process, and between adsorbate and surface, as a "chemicurrent." The hot electrons may travel from a conducting surface, which may include a catalyst layer, through an optional intermediate layer and into the quantum well. The transfer of energy into the quantum well also includes creation of hot phonons in a catalyst, and includes propagation of the phonons into the quantum well.

Figure 3:
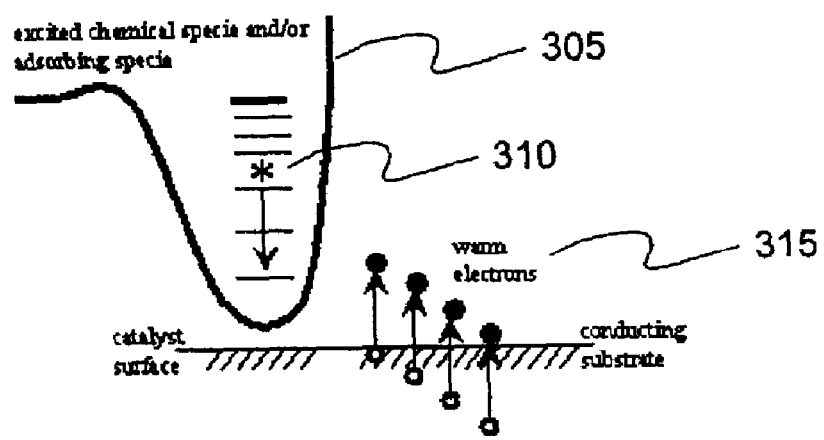
FIG. 3 is a schematic diagram depicting the process by which hot electrons may be generated by a chemical reaction on a catalyst surface.

FIG. 3 is an illustration of the formation of hot electrons (a.k.a. warm electrons) at the surface of the catalyst layer 120. In FIG. 3, as energy is released by the chemical reaction, warm electrons are generated. A specie adsorbing on the surface of the catalyst may be represented by the potential well 305 into which it settles, with quantized energy 310 levels depicted. A transition from a higher excited state to a lower state represents loss of energy to the catalyst and to the substrate via EHPs 315 and may also result in a more tightly bound adsorbate.

Figure 4:
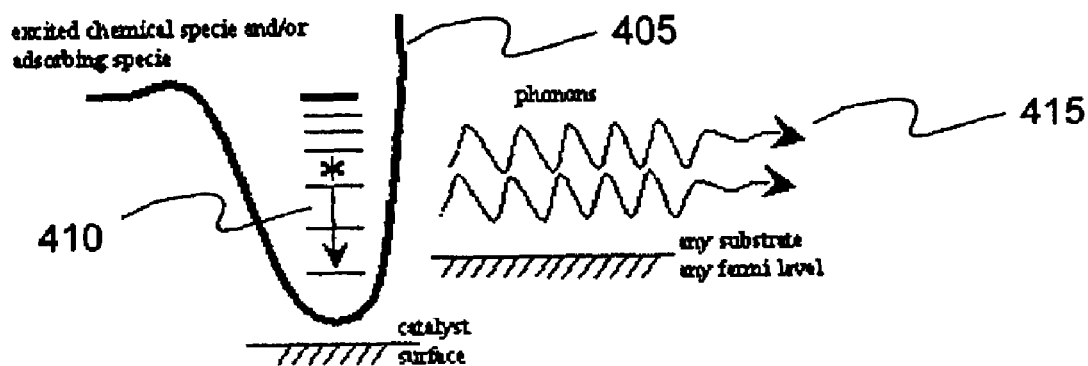
FIG. 4 is a schematic diagram depicting the process by which hot phonons may be generated by a chemical reaction on a catalyst surface.

FIG. 4 is an illustration of the formation of phonons at the surface of the catalyst layer. In FIG. 4, as energy is released by the chemical reaction, phonons are generated. Much like FIG. 3, a specie adsorbing on the surface of the catalyst may be represented by the potential well 405 into which it settles, with quantized energy levels 410 depicted. A transition from a higher excited state to a lower state represents a loss of energy to the catalyst and to the substrate via phonons 415 and may also result in a more tightly bound adsorbate. FIG. 4 may also represent excited state reaction products on or near a catalyst or conducting surface. Energy decay from a higher quantum level to a lower level represents energy transfer of molecular, ionic, vibrational, electronic, or rotational energy, forming phonons in the catalyst and substrate. These mechanisms for the generation of hot phonons have been observed. Decay of hot electrons and electron hole pairs in semiconductors and some metals is predominantly via LO and TO phonons (Longitudinal Optical, Transverse Optical phonons).

Figure 5:
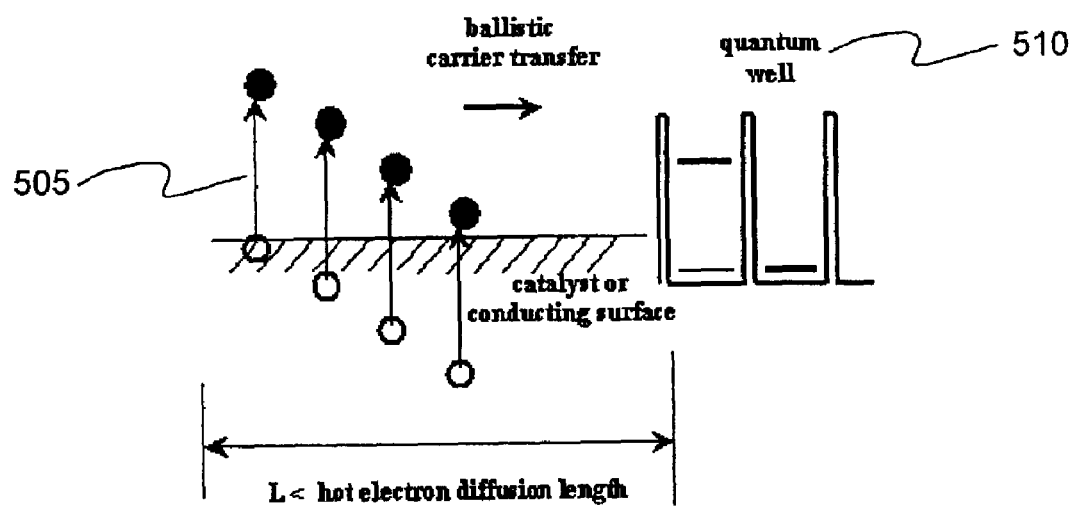
FIG. 5 is a schematic diagram depicting the process by which hot electrons may be injected into and thereby energize a quantum well device.

The process of injecting hot electrons into the quantum well is shown schematically in FIG. 5. In FIG. 5, the hot electrons 505 may be formed with varying energies relative to the Fermi level of the catalyst or substrate. The carriers travel directly into the quantum well 510 in contact with the substrate or catalyst. Carriers penetrate the quantum well barriers at the boundary, travel through appropriately thin interlayers and energize the well. Research has shown that when the catalyst layer on a semiconductor has a thickness dimension less than tens of nanometers, any quantum mechanical barriers (i.e. Schottky barriers) become sufficiently transparent to hot carriers such as hot electrons, thereby allowing the hot electrons to pass directly into the quantum well. This form of energizing a quantum well is referred to as "flat band" energizing because the Fermi level of the catalyst and the Fermi level of the quantum well may be in equilibrium, or "flat." According to another embodiment, however, an electrical bias can be applied across the catalyst layer 120 and the quantum well 110 to enhance some resonance and energy transfer and decrease others. The applied bias may be either DC bias or a bias resulting from a time varying voltage, such as one finds in an electromagnetic radiation cavity. According to yet another embodiment, the partition of energy between the phonon and hot electrons can be tailored by the choice of catalyst material, crystal types and by use of superlattices, as explained, and in some cases without constraints of Fermi levels.

Figure 6:
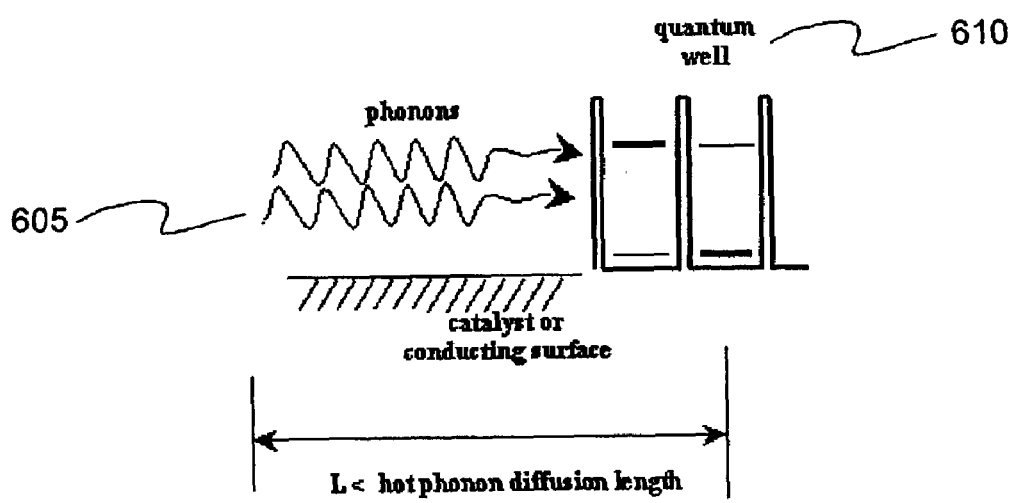
FIG. 6 is a schematic diagram depicting the process by which hot phonons may be injected into and thereby energize a quantum well device.
Figure 7:
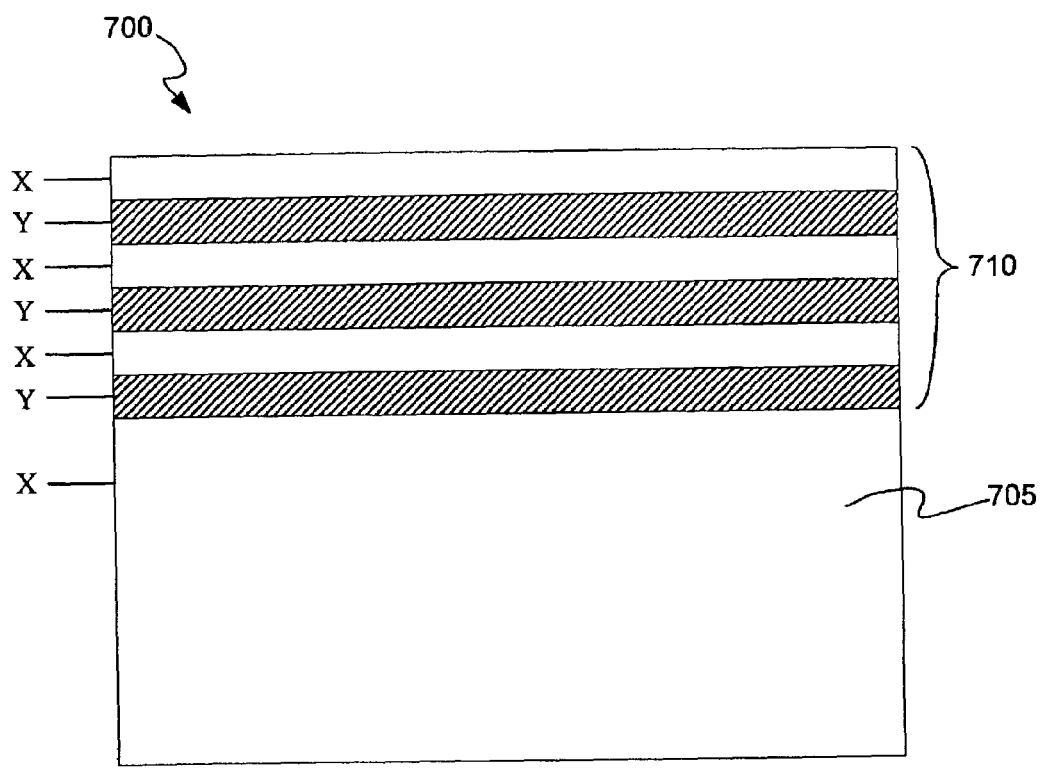
FIG. 7 is a cross-sectional diagram of a representative quantum well device.
Figure 8:
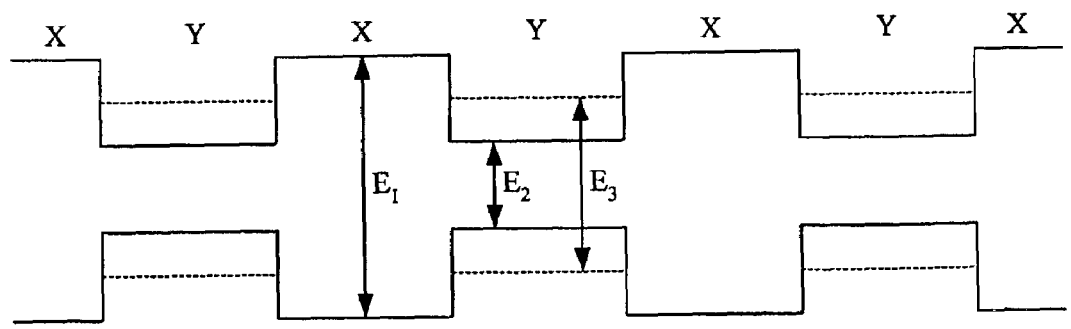
FIG. 8 is a band-gap diagram of the representative quantum well device depicted in FIG. 7.

The injection of hot phonons into a quantum well structure is shown schematically in FIG. 6. In FIG. 6, hot phonons 605 may be formed with varying energies relative to the Fermi level of the catalyst or substrate. The carriers travel directly into the quantum well 610 in contact with the substrate or catalyst. Carriers penetrate the quantum well barriers at the boundary, travel through appropriately thin interlayers, and energize the well.

Hot electrons dissipate their energy mainly through the interaction with lattices, existing phonons and the creation of additional hot phonons. The catalyst layer 120, the catalyst interlayer 205, and the catalyst interface (not depicted) may be chosen with phonon coupling properties and thicknesses so that many of the hot electrons passing through these layers transfer their energy into hot phonons. Alternatively, the quantum well interface 115 or the quantum well 110 may be adapted so that the hot electrons energize hot phonons in these layers, assuming that the catalyst layers 120, 205 are sufficiently thin.

Material choices for these layers are based on phonon frequency tailoring and the considerations of the high frequency phonon bands of the materials. Superlattices, such as multiple monolayer metal superlattices, permit construction of phonon band gaps, modified electron density of states that show multiple resonance peaks, or structures that favor generation of hot electrons. The method of favoring the production of either phonon or hot electrons includes constructing a superlattice over the quantum well and of choosing materials, compounds and complexes of materials, and forming structures such as islands, chaotic islands, quantum structures such as stadia and layered constructs.

The methods for capturing energy from hot electrons and phonons includes capturing hot electrons generated by the adsorption process of reactants and by vibrational energy decay of products formed on the catalyst. Capture methods also include capturing hot phonons generated by the adsorption process of reactants and by the vibrational energy decay of products formed on the catalyst. Another method for capturing energy includes capturing hot electrons and phonons generated by the trapping of hot atoms formed on the catalyst. Capturing hot electrons also includes capturing energy from carriers that had been directly injected into the quantum well. Methods of capturing carriers include constructing the entire device so that the distance from the adsorbing reactant or energized reactant to the quantum well is less than several times (5 times) the energy diffusion length of the energy emission modes.

Capturing energy from hot phonons also includes direct injection of these phonons into the quantum well. Capturing energy from these phonons further includes conversion of phonon energies into phonons of other energies and other types. This capture process also includes conversion of phonon types into other types, especially conversion of phonons into Longitudinal Optical Phonons. According to one embodiment, the entire device is constructed so that the distance from the adsorbing reactant or energized reaction products on or near the reaction or catalyst surface to the quantum well is less than several times (5 times) the energy diffusion length of the generated phonons. Phonon capture methods also include capturing energy generated by the recombination of EHPs and generating EHPs in one location and converting them into phonons of a more useful type in another location, such as by recombination of EHPs.

Inside the quantum well devices, the phonons interact with the phonon bands of the quantum well materials and with discontinuities of physical properties such as sound speed, sound index of refraction, and specie mass. At the interface of the quantum well, hot acoustic phonons and hot optical phonons, both transverse and longitudinal, may mix and convert from one to the other. An embodiment of the invention chooses various crystal materials and structure combinations to enhance this conversion. For example, wurtzite crystals such as GaN have vibration modes that cannot be described simply as purely longitudinal modes or purely transverse modes. There is a TO component in a LO-like mode and an LO component in a TO-like mode. Mixing metals and semiconductors, such as those with the zinc-blende structure (GaAs) and the wurtzite structure (GaN) is one method for tailoring these phonon conversions.

Although certain embodiments and aspects of the present inventions have been illustrated in the accompanying drawings and described in the foregoing detailed description, it will be understood that the inventions are not limited to the embodiments disclosed, but are capable of numerous rearrangements, modifications and substitutions without departing from the spirit of the invention as set forth and defined by the following claims and equivalents thereof. Applicant intends that the claims shall not invoke the application of 35 U.S.C §112, ¶6 unless the claim is explicitly written in means-plus-step or means-plus-function format.

We claim:

1. A method for energizing a quantum well comprising:
   providing a quantum well energizing apparatus comprising a catalyst layer having at least islands, corrals, chaotic surface constructs, pyramids, or monolayered islands on the upper surface of the catalyst layer, and an interface layer disposed between the catalyst layer and a quantum well;
   providing chemical reactants on the upper surface of the catalyst layer so that a chemical reaction is catalyzed on the upper surface of the catalyst layer;
   capturing hot electrons and hot phonons generated by the chemical reaction in the catalyst layer;
   providing the captured hot electrons and hot phonons to the interface layer;
   injecting the captured hot electrons and hot phonons from the interface layer into the adjoining quantum well; and
   converting the energy of the hot electrons and hot phonons into charge carriers that energize the quantum well.

2. A method for energizing a quantum well according to claim 1, further comprising converting a plurality of the captured hot electrons into longitudinal optical phonons.

3. A method for energizing a quantum well according to claim 2, wherein converting the plurality of captured hot electrons occurs in the interface layer.

4. A method for energizing a quantum well according to claim 1, further comprising removing exhaust products produced by the chemical reaction from the surface of the catalyst layer.

5. A method for energizing a quantum well according to claim 1, wherein the chemical reactants comprise a fuel.

6. A method for energizing a quantum well according to claim 1, further comprising adsorbing a chemical reactant onto the upper surface of the catalyst layer.

7. A method for energizing a quantum well according to claim 1, wherein the catalyst layer has one or more catalyst structures formed with 20 nanometer dimensions.

8. A method for energizing a quantum well according to claim 1, wherein the catalyst layer comprises substance selected from the group consisting of platinum, palladium, rhodium, and ruthenium.

9. A method for energizing a quantum well according to claim 1, wherein the catalyst layer comprises a transition metal.

10. A method for energizing a quantum well according to claim 1, wherein the thickness of the catalyst and interface layers is such that the hot electrons or the hot phonons are communicated directly from the chemical reaction to the quantum well.

11. A method for energizing a quantum well according to claim 1, wherein the catalyst layer comprises at least a metal substance.

12. A method for energizing a quantum well according to claim 11, wherein the metal substance includes platinum, palladium, rhodium, ruthenium, or transitions metals.

13. A method for energizing a quantum well comprising:

providing a quantum well energizing apparatus comprising at least a catalyst layer, and an interface layer disposed between the catalyst layer and a quantum well;

providing chemical reactants on or near the catalyst layer so that a chemical reaction is catalyzed on the catalyst layer;

capturing hot electrons or hot phonons or both hot electrons and hot phonons generated by the chemical reaction in the catalyst layer;

providing the captured hot electrons or hot phonons or both hot electrons and hot phonons to the interface layer;

injecting the captured hot electrons or hot phonons or both hot electrons and hot phonons from the interface layer into the adjoining quantum well; and converting energy of the hot electrons or hot phonons or both hot electrons and hot phonons into charge carriers that energize the quantum well.

* * * * *